(12) United States Patent
Du et al.

(10) Patent No.: US 12,507,404 B2
(45) Date of Patent: Dec. 23, 2025

(54) THREE-DIMENSIONAL MEMORIES HAVING ISOLATION STRUCTURES AND FABRICATION METHODS THEREOF

(71) Applicant: YANGTZE MEMORY TECHNOLOGIES CO., LTD., Wuhan (CN)

(72) Inventors: Xiaolong Du, Wuhan (CN); Tingting Gao, Wuhan (CN); Zhiliang Xia, Wuhan (CN); Changzhi Sun, Wuhan (CN); Jiayi Liu, Wuhan (CN); Xiaoxin Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 575 days.

(21) Appl. No.: 17/729,411

(22) Filed: Apr. 26, 2022

(65) Prior Publication Data

US 2023/0071503 A1 Mar. 9, 2023

Related U.S. Application Data

(63) Continuation of application No. PCT/CN2021/116668, filed on Sep. 6, 2021.

(51) Int. Cl.
  *H10B 41/27* (2023.01)
  *H10B 43/27* (2023.01)

(52) U.S. Cl.
  CPC ............. *H10B 41/27* (2023.02); *H10B 43/27* (2023.02)

(58) Field of Classification Search
  CPC ......... H10B 41/27; H10B 43/27; H10B 43/35
  USPC ....................................................... 257/314
  See application file for complete search history.

(56) References Cited

U.S. PATENT DOCUMENTS

| | | | |
|---|---|---|---|
| 9,236,394 B2 * | 1/2016 | Rhie | H10D 30/693 |
| 10,290,643 B1 * | 5/2019 | Kai | H01L 29/7883 |
| 2008/0173928 A1 * | 7/2008 | Arai | H10B 41/27 |
| | | | 257/E21.409 |
| 2011/0215394 A1 * | 9/2011 | Komori | H10B 43/27 |
| | | | 257/E21.423 |
| 2015/0364487 A1 | 12/2015 | Yun | |

(Continued)

FOREIGN PATENT DOCUMENTS

| | | |
|---|---|---|
| CN | 104124252 A | 10/2014 |
| CN | 107810554 A | 3/2018 |

(Continued)

*Primary Examiner* — Duy T Nguyen
*Assistant Examiner* — Pratiksha Jayant Lohakare
(74) *Attorney, Agent, or Firm* — BAYES PLLC

(57) ABSTRACT

The three-dimensional memory includes a stack structure which includes: a first stack and a second stack, the first stack including control gate layers and first dielectric layers which are stacked alternately, the second stack including top select gate layers and second dielectric layers which are stacked alternately in the same stacking direction; a plurality of channel structures which run though the stack structure and include charge storage layers, the charge storage layers including a plurality of charge storage portions disposed discontinuously in the stacking direction, the charge storage portions being disposed between the adjacent first dielectric layers; and at least one isolation structure which runs through the top select gate layers and is located between the adjacent channel structures.

20 Claims, 17 Drawing Sheets

(56) References Cited

U.S. PATENT DOCUMENTS

| | | | | |
|---|---|---|---|---|
| 2016/0336306 A1* | 11/2016 | Lee | ........................ | H01L 21/283 |
| 2017/0236836 A1* | 8/2017 | Huo | ........................ | H10D 1/00 |
| | | | | 257/324 |
| 2017/0294444 A1* | 10/2017 | Jiang | ........................ | H10B 43/30 |
| 2018/0108669 A1* | 4/2018 | Zhu | ..................... | H01L 29/1037 |
| 2019/0386108 A1 | 12/2019 | Nishikawa et al. | | |
| 2020/0058672 A1* | 2/2020 | Nishikawa | ............. | H10B 43/10 |
| 2020/0203363 A1* | 6/2020 | Lue | ..................... | H10D 64/035 |
| 2020/0395375 A1* | 12/2020 | Huo | ........................ | H10B 43/27 |
| 2021/0193674 A1 | 6/2021 | Said et al. | | |

FOREIGN PATENT DOCUMENTS

| | | | |
|---|---|---|---|
| CN | 10047839 B | * | 7/2019 |
| CN | 110211964 A | | 9/2019 |
| CN | 110678987 A | | 1/2020 |
| CN | 110741475 A | | 1/2020 |
| CN | 110914989 A | | 3/2020 |
| CN | 110914990 A | | 3/2020 |
| CN | 112259549 A | | 1/2021 |
| CN | 112310093 A | | 2/2021 |
| CN | 112447751 A | | 3/2021 |
| CN | 113206106 A | | 8/2021 |
| KR | 20100113360 A | | 10/2010 |

\* cited by examiner

300

S310 Forming a plurality of initial charge storage portions in the respective recesses S320 Removing the remaining parts of the sacrificial layers to expose the initial charge storage portions on sides away from the channel holes S330 Oxidizing at least part of the exposed initial charge storage portions to discontinuous charge blocking portions

THREE-DIMENSIONAL MEMORIES HAVING ISOLATION STRUCTURES AND FABRICATION METHODS THEREOF

CROSS-REFERENCES TO RELATED APPLICATIONS

This application is a continuation of International Application No. PCT/CN2021/116668, filed on Sep. 6, 2021, which is incorporated herein by reference in its entirety.

BACKGROUND

The present application relates to the technical field of semiconductors. Specifically, the present application relates to a three-dimensional memory device and a fabrication method thereof.

With the increase in the number of stacked layers of a three-dimensional memory, gate layers and dielectric layers in the stacks generally require thinning treatment to reduce an overall height of the stacks to alleviate a load arising from deep hole etching. However, thickness reduction of the gate layers and the dielectric layers generates a coupling effect between memory cells, and reduces a data retention ability of the three-dimensional memory.

It should be understood that, the BACKGROUND portion is intended to partially provide a useful background to understand the technology. However, these contents do not necessarily belong to those known to or understood by those skilled in the art prior to the filing date of the present application.

SUMMARY

One aspect of the present application provides a three-dimensional memory, comprising: a stack structure which comprises a first stack and a second stack, the first stack comprising control gate layers and first dielectric layers which are stacked alternately, the second stack comprising top select gate layers and second dielectric layers which are stacked alternately in the same stacking direction; a plurality of channel structures which run though the stack structure and comprise charge storage layers, the charge storage layers comprising a plurality of charge storage portions disposed discontinuously in the stacking direction, the charge storage portions being disposed between the adjacent first dielectric layers; and at least one isolation structure which runs through the top select gate layers and is located between the adjacent channel structures.

In an implementation of the present application, materials of the top select gate layers and the control gate layers are different.

In an implementation of the present application, the top select gate layers comprise a semiconductor material.

In an implementation of the present application, the semiconductor material comprises polysilicon or metal nitride.

In an implementation of the present application, the semiconductor material comprises boron-doped polysilicon.

In an implementation of the present application, the control gate layers comprise a metal.

In an implementation of the present application, the metal comprises tungsten.

In an implementation of the present application, the channel structures comprise a plurality of first portions surrounded by the control gate layers, and a plurality of second portions surrounded by the second stack and the first dielectric layers, wherein a first radial dimension of the first portions is greater than a second radial dimension of the second portions.

In an implementation of the present application, each first portion comprises first charge blocking portions and the charge storage portions, and between the adjacent first dielectric layers, the charge storage portions cover sidewalls of the first charge blocking portions.

In an implementation of the present application, the first portions further comprise tunneling layers, channel layers and dielectric cores which are disposed in sequence on sidewalls of the charge storage portions.

In an implementation of the present application, the first charge blocking portions cover inner walls surrounded by the adjacent first dielectric layers and the control gate layers therebetween.

In an implementation of the present application, the second portions comprise a plurality of second charge blocking portions, the tunneling layers, the channel layers and the dielectric cores which are disposed in sequence on sidewalls of the second stack and the first dielectric layers, wherein the first charge blocking portions and the second charge blocking portions constitute continuous blocking layers.

In an implementation of the present application, the first charge blocking portions cover sidewalls of the control gate layers.

In an implementation of the present application, the second portions comprise the tunneling layers, the channel layers and the dielectric cores which are disposed on the sidewalls of the second stack and the first dielectric layers.

In an implementation of the present application, in the stacking direction, the first charge blocking portions and the charge storage portions have the same dimension.

In an implementation of the present application, in the stacking direction, the first charge blocking portions and the control gate layers have the same dimension.

In an implementation of the present application, the first charge blocking portions comprise silicon oxynitride or silicon oxide, and the charge storage portions comprise silicon nitride.

Another aspect of the present application provides another three-dimensional memory, comprising: a stack structure which comprises a first stack and a second stack, the first stack comprises first dielectric layers and control gate layers which are stacked alternately, the second stack comprises second dielectric layers and top select gate layers which are stacked alternately in the same stacking direction, wherein the control gate layers comprise a metal, the top select gate layers comprise a semiconductor material; a plurality of channel structures which run though the stack structure and comprise charge storage layers, the charge storage layers comprise a plurality of charge storage portions disposed discontinuously in the stacking direction, the charge storage portions are disposed between the adjacent first dielectric layers; and at least one isolation structure which runs through the top select gate layers and is located between the adjacent channel structures.

Still another aspect of the present application provides a fabrication method of a three-dimensional memory, comprising forming, in sequence, a first stack that is stacked alternately by first dielectric layers and sacrificial layers, and a second stack that is stacked alternately by second dielectric layers and conductive layers; forming channel holes through the first stack and the second stack; removing at least part of the respective sacrificial layers from the first stack through the channel holes to form recesses between the adjacent first dielectric layers in the first stack; forming channel structures in the recesses and the channel holes; and forming an isolation structure in the second stack, wherein the isolation structure runs through the conductive layers and is located between the adjacent channel structures.

In an implementation of the present application, the method further includes forming gate slits running through the first stack and the second stack; removing the remaining parts of the sacrificial layers through the gate slits; and forming conductor layers in sacrificial spaces formed after removing the remaining parts.

In an implementation of the present application, the isolation structure is formed before formation of the channel holes.

In an implementation of the present application, the isolation structure is formed after formation of the channel structures.

In an implementation of the present application, the isolation structure is formed after formation of the conductor layers.

In an implementation of the present application, forming the isolation structure includes forming an opening running through the second stack and being located between the adjacent channel structures; and filling the opening with an insulating material.

In an implementation of the present application, the forming the channel structures includes forming continuous blocking layers on inner walls of the recesses, and sidewalls of the second stack and the first dielectric layers along the channel holes; and forming charge storage portions in each of the recesses.

In an implementation of the present application, the forming the channel structures further comprises:

forming, in sequence, tunneling layers, channel layers and dielectric cores on portions of the blocking layers along sidewalls of the channel holes, and the charge storage portions.

In an implementation of the present application, the forming the channel structures comprises:

forming a plurality of discontinuous charge storage portions and a plurality of discontinuous charge blocking portions in the recesses.

In an implementation of the present application, the forming the plurality of discontinuous charge storage portions and the plurality of discontinuous charge blocking portions in the respective recesses comprises: forming a plurality of initial charge storage portions in the respective recesses; removing the remaining parts of the sacrificial layers to expose the initial charge storage portions on the sides away from the channel holes; and oxidizing at least part of the exposed initial charge storage portions to the charge blocking portions.

In an implementation of the present application, before forming the discontinuous charge storage portions, the method further includes in the respective recesses, forming etch stop layers on sidewalls of the sacrificial layers.

In an implementation of the present application, removing the remaining parts of the sacrificial layers includes etching the remaining parts of the sacrificial layers and stopping at the etch stop layers; and removing the etch stop layers.

In an implementation of the present application, the forming the channel structures further includes disposing, in sequence, tunneling layers, channel layers and dielectric cores on a sidewall of the second stack, the charge storage portions and sidewalls of the first dielectric layers.

BRIEF DESCRIPTION OF THE DRAWINGS

Other features, purposes and advantages of the present application will become more apparent by reading the detailed description of non-limitative embodiments made by reference to the following figures. Among the figures.

DETAILED DESCRIPTION

Figure 1:
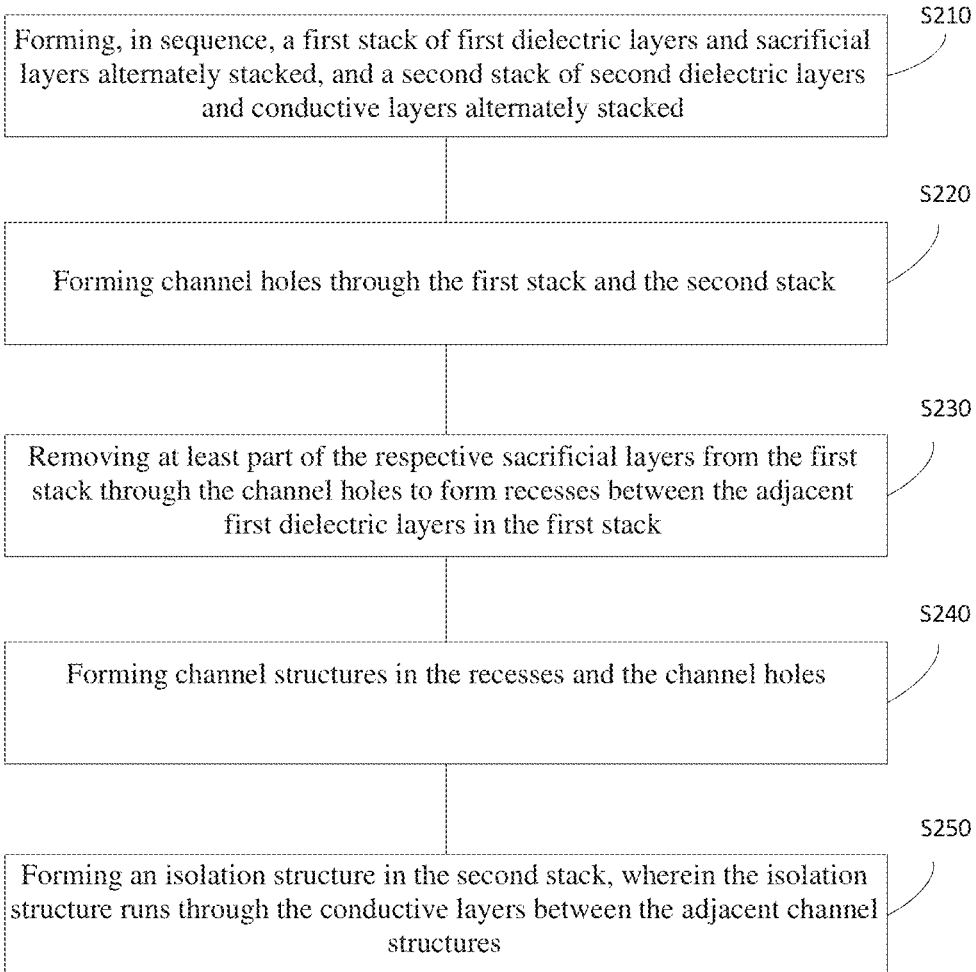
FIG. 1 is a flow diagram of a fabrication method of a three-dimensional memory according to some implementations of the present application.

In order for better understanding of the present application, respective aspects of the present application will be described in more detail by reference to the drawings. It is understood that, these detailed descriptions merely describe exemplary implementations of the present application, instead of restricting the scope of the present application in any manner. Like reference numbers denote like elements throughout the specification.

It is noted that references in the specification to "an implementation", "implementation", "an example implementation", "some implementations", etc., indicate that the implementation described may include a particular feature, structure, or characteristic, but every implementation may not necessarily include the particular feature, structure, or characteristic. Moreover, such phrases do not necessarily refer to the same implementation. Further, when a particular feature, structure, or characteristic is described in connection with an implementation, it would be within the knowledge of a person skilled in the pertinent art to effect such feature, structure or characteristic in connection with other implementations whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a/an" or "the" again, can be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on", "above", and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath", "below", "lower", "above", "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein and/or can have one or more layer thereupon, thereabove, and/or therebelow. A layer can include multiple layers.

For ease of description, the thicknesses, dimensions and shapes of components have been slightly adjusted in the figures. The figures are merely exemplary and are not drawn to scale strictly. For example, as used herein, terms, "approximately", "about", and similar terms, are used to represent approximation, instead of representing a degree, and are intended to describe an inherent deviation in a measured value or a calculated value as recognized by those of ordinary skill in the art.

It is also understood that, expressions of "comprise", "comprising", "have", "include", and/or "including", when used in the description, represent that there exists the stated features, elements and/or components, but the existence or addition of one or more another features, elements, components and/or combinations thereof is not precluded. Moreover, the expression, such as "at least one of . . . ", appearing after a list of listed features, modifies the whole list of features, rather than an individual element therein. Furthermore, "may" is used to represent "one or more implementations of the present application" when implementations of the present application are described. Moreover, the term "exemplary" is intended to refer to an example or exemplification.

Unless otherwise defined, all phraseologies (including engineering terms and technical terms) as used herein have the same meanings as those generally understood by those of ordinary skill in the art to which the present application pertains. It is further understood that, terms as defined in common dictionaries should be interpreted as having a meaning that is consistent with their meaning in the context of the relevant art, and should not be interpreted in an idealized or overly formal sense unless otherwise stated expressly in the present application.

It should be noted that, implementations and features in the implementations of the present application may be mutually combined in the case of no conflicts. In addition, unless otherwise defined clearly or conflicting with the context, specific steps included in a method as set forth in the present application are not necessarily limited to an order as set forth, but may be carried out in any order or in parallel. The present application will be detailed below by reference to the drawings and in conjunction with the implementations.

Implementation I

As shown in FIG. 1 which illustrates a flow diagram of a fabrication method 200 of a three-dimensional memory according to some implementations of the present application, Implementation I comprises respective operations of the method 200. The Implementation is described below by reference to local schematic diagrams of device structures formed by the fabrication method of the three-dimensional memory at respective stages as shown in FIGS. 2-17 respectively. When the Implementation is described, for ease of illustration, a schematic diagram representing a device structure will be partially enlarged not to general scale, and the schematic diagram is merely exemplary and should not restrict the protection scope of the present application herein. Furthermore, three-dimensional spatial dimensions, i.e., length, width and depth, should be included in practical fabrication. It should be understood that, operations as illustrated in the method are not exhaustive, and other operations may also be carried out before, after or between any of the described operations.

Figure 2:
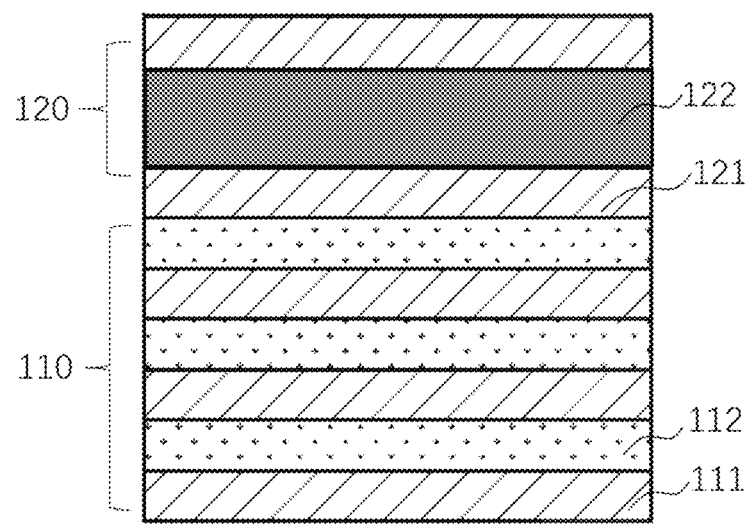
FIG. 2 is a local schematic diagram of a device structure after formation of a stack structure of a fabrication method of a three-dimensional memory according to some implementations of the present application.

Referring to FIG. 1, a fabrication method 200 of a three-dimensional memory according to some implementations of the present application may form, in sequence, a first stack 110 (FIG. 2) of first dielectric layers and sacrificial layers alternately stacked, and a second stack 120 (FIG. 2) of second dielectric layers and conductive layers alternately stacked in Operation S210. As shown in FIG. 2, a stack structure of first stack 110 and the second stack 120 stacked together is formed in sequence on a substrate (not shown), wherein a preparation material of the substrate may choose any suitable semiconductor material, for example, may be monocrystalline silicon, polysilicon, monocrystalline germanium (Ge), silicon germanium (GeSi), silicon carbide (SiC), silicon on insulator (SOI), germanium on insulator (GOI), or III-V compounds, such as gallium arsenide, etc.

In some implementations, the first stack 110 may be formed by alternately stacking a plurality of first dielectric layers 111 and sacrificial layers 112. The first stack 110 may comprise a plurality of pairs of first dielectric layers 111/sacrificial layers 112, and the number of the pairs may be selected according to various application scenes. In some examples, a material of the first dielectric layers 111 comprises silicon oxide, silicon nitride, silicon oxynitride, organosilicate glass (OSG), a spin-coating dielectric material, a dielectric metal oxide generally known as a high dielectric constant (high k) dielectric oxide (for example, aluminum oxide, hafnium oxide, etc.) and silicate thereof, dielectric metal oxynitride and silicate thereof, and an organic insulating material. Under the same etching process, the first dielectric layers 111 has a higher etching selectivity than the sacrificial layers 112 to ensure that the first dielectric layers 111 are almost not removed when the sacrificial layers 112 are removed subsequently. As an example, the first dielectric layers 111 may comprise silicon oxide, and the sacrificial layers 112 may comprise silicon nitride. In some implementations, the first stack 110 may be formed above the substrate by repeatedly and alternately performing a deposition process of the first dielectric layers 111 and the sacrificial layers 112. The deposition process, for example, may be a film deposition process including chemical vapor deposition (CVD), physical vapor deposition (PVD), atomic layer deposition (ALD), or any combination thereof.

On the first stack 110, in the same stacking direction, the second stack 120 may be formed by alternately stacking a plurality of second dielectric layers 121 and conductive layers 122. Exemplarily, the second stack 120 may comprise at least one pair of second dielectric layer 121/conductive layer 122, and the number of the pairs may be less than that of the pairs of first dielectric layers 111/sacrificial layers 112. As an example, the number of the pairs of second dielectric layer 121/conductive layer 122, for example, may be 1, 2, 4 or more. In some examples, a film deposition process including chemical vapor deposition (CVD), physical vapor deposition (PVD), atomic layer deposition (ALD) or any combination thereof may be used to alternately deposit the second dielectric layers 121 and the conductive layers 122 to form the second stack 120. In some implementations, since more and more layers are required for the stacks, in order to increase the deposition time to increase productivity, a deposition process with a higher deposition rate is generally adopted, for example, chemical vapor deposition.

In some examples, a material of the conductive layers 122 may comprise any suitable conductive material, wherein the sacrificial layers 112 have a higher etching selectivity than the conductive layers 122 to permit retention of the conductive layers 122 when at least part of the sacrificial layers 112 is removed. Exemplarily, a process for removing at least part of the sacrificial layers 112 may comprise isotropic wet etching. Under the same wet etching process, the sacrificial layers 112 have a higher etching selectivity than the conductive layers 122 to ensure that the conductive layers 122 are almost not removed when the sacrificial layers 112 are removed subsequently.

In some examples, a conductive material of the conductive layers 122 may comprise a semiconductor material which, for example, may comprise polysilicon or metal silicide. As an option, the conductive layers 122 comprise P-type doped (e.g., boron-doped) polysilicon such that a threshold voltage of a top select gate transistor is positive when the conductive layers 122 serve as top select gate layers, thereby turning off a controlled channel.

In some examples, a conductive material of the conductive layers 122 may comprise a metal, such as W, Co, Cu, Al, Ti, Ta, Ni, etc., which has such a work function that a threshold voltage of a top select gate transistor is positive when the conductive layers 122 serve as top select gate layers, thereby turning off a controlled channel.

In some examples, to simplify a fabrication process, a material of the second dielectric layers 121 may be the same as that of the first dielectric layers 111.

In some embodiments, a staircase structure (not shown in FIG. 2) may be formed on the two sides or in a position near the middle of the stack structure to lead out word lines. Formation of the staircase structure may comprise using a mask layer (e.g., patterned photoresist) above the stack structure to repeatedly etch the second dielectric layers 121 and the conductive layers 122 as well as the sacrificial layers 112 and the first dielectric layers 111. Exemplarily, the mask layer may be trimmed to expose portions to be etched of the second dielectric layers 121 and the conductive layers 122 as well as the sacrificial layers 112 and the first dielectric layers 111, such that the exposed portions may be etched by a suitable etching process. It should be understood that, the staircase structure may be formed at any suitable stage of the fabrication method of the three-dimensional memory, without departing from the teaching of the present disclosure.

Referring back to FIG. 1, the fabrication method 200 of the three-dimensional memory according to some implementations of the present application proceeds to Operation S220, and in Operation S220, a plurality of channel holes 130 (FIG. 3) running through the first stack 110 and the second stack 120 are formed.

Figure 3:
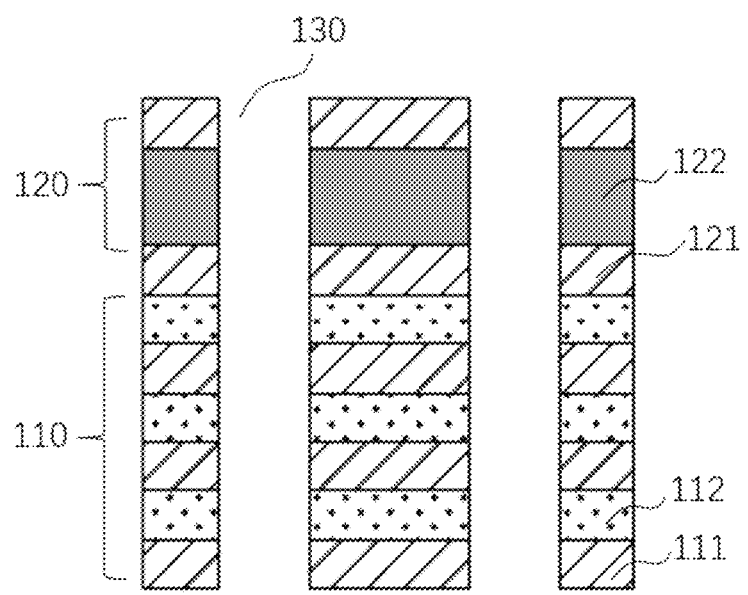
FIG. 3 is a local schematic diagram of a device structure after formation of channel holes of a fabrication method of a three-dimensional memory according to some implementations of the present application.

As shown in FIG. 3, the channel holes 130 may be formed in the stack structure (the first stack 110 and the second stack 120). In some implementations, the plurality of channel holes 130 are distributed in an array manner in the stack structure, and each channel hole 130 vertically extends into the substrate (not shown). Furthermore, the channel holes 130 may have a high aspect ratio, and may be formed by etching the stack structure. Exemplarily, the channel holes 130 may be formed by forming a mask layer (not shown) on the stack structure, and patterning the mask layer using, for example, a lithography process, and then etching the first stack 110 and the second stack 120 by carrying out a suitable etching process, for example, wet etching, dry etching or a combination thereof. In some implementations, the mask layer may be removed after the formation of the plurality of channel holes 130.

Referring back to FIG. 1 again, the fabrication method 200 of the three-dimensional memory according to some implementations of the present application further comprises Operation S230 to remove at least part of the respective sacrificial layers 112 from the first stack 110 through the channel holes 130 to form recesses 103 (FIG. 4) between every adjacent first dielectric layers 111 in the first stack 110.

Figure 4:
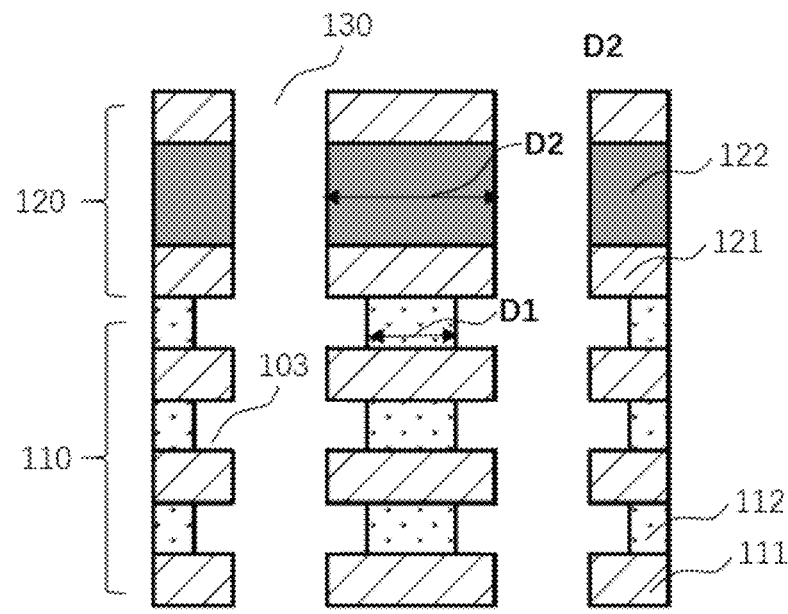
FIG. 4 is a local schematic diagram of a device structure formed after removal of at least part of sacrificial layers of a fabrication method of a three-dimensional memory according to some implementations of the present application.

As shown in FIG. 4, at least part of the respective sacrificial layers 112 may be removed through the channel holes 130 to form the recesses 103, wherein the recesses 103 may be communicated with the channel holes 130 perpendicularly or approximately perpendicularly. In some implementations, part of each sacrificial layer 112 parallel to the stacking direction and perpendicular to or approximately perpendicular to the stacking direction may be removed through the channel holes 130 by an isotropic wet etching process to expose part of a top surface and a bottom surface of each first dielectric layer 111, and sidewalls of the sacrificial layers 112 may also be exposed to form the recesses 103.

Referring to FIG. 4 again, in the second stack 120, the adjacent channel holes 130 have a wall thickness D2 therebetween; the recesses 103 perpendicularly or approximately perpendicularly communicated with the channel holes 130 are formed between the adjacent first dielectric layers 111, so that in the first stack 110, the adjacent channel holes 130 have a different and alternative wall thickness therebetween; at the first dielectric layers 111, the adjacent channel holes 130 may have the wall thickness D2 therebetween, while at the sacrificial layers 112, the adjacent channel holes 130 have a wall thickness D1 therebetween, wherein D2 is greater than D1.

As shown in FIG. 1, the fabrication method 200 of the three-dimensional memory according to some implementations of the present application further comprises Operation S240 to form channel structures 139 (FIG. 8) in the recesses 103 and the channel holes 130. FIGS. 5-8 illustrate schematic diagrams of respective stages of forming the channel structures.

Figure 5:
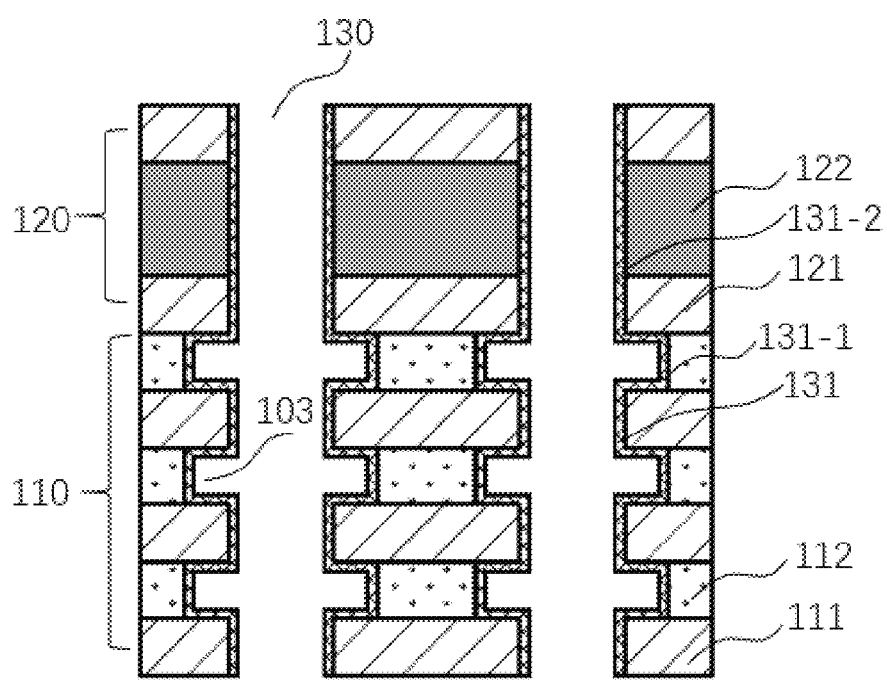
FIG. 5 is a local schematic diagram of a device structure after formation of continuous blocking layers of a fabrication method of a three-dimensional memory according to Implementation I of the present application.

As shown in FIG. 5, in some implementations, continuous blocking layers 131 may be formed on inner walls of the recesses 103, and sidewalls of the second stack 120 and the first dielectric layers 111 along the channel holes 130 using a suitable film deposition process, e.g., chemical vapor deposition (CVD), physical vapor deposition (PVD), atomic layer deposition (ALD) or any combination thereof. In some examples, a material for the blocking layers 131 may comprise silicon oxide, silicon nitride, silicon oxynitride, and a high-K dielectric material such as aluminum oxide or hafnium oxide.

Referring to the example as shown in FIG. 5 again, the blocking layers 131 may comprise first charge blocking portions 131-1 and second charge blocking portions 131-2, wherein the first charge blocking portions 131-1 may, in the recesses 103, cover the sidewalls of the sacrificial layers 112 and part of the bottom surfaces and the top surfaces of the first dielectric layers 111 adjacent to the sacrificial layers 112. The second charge blocking portions 131-2 may cover the sidewalls of the second stack 120 and the first dielectric layers 111 along the channel holes 130.

Figure 6:
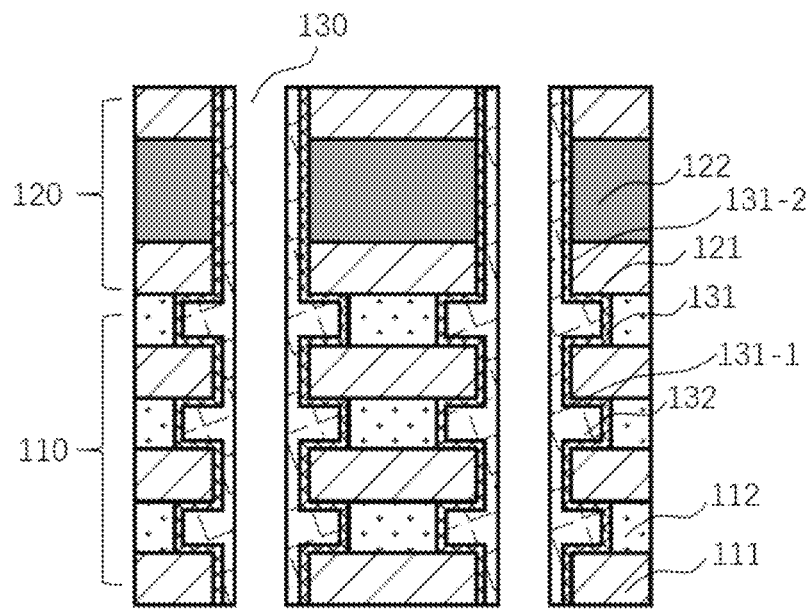
FIG. 6 is a local schematic diagram of a device structure after formation of continuous storage layers of a fabrication method of a three-dimensional memory according to Implementation I of the present application.
Figure 7:
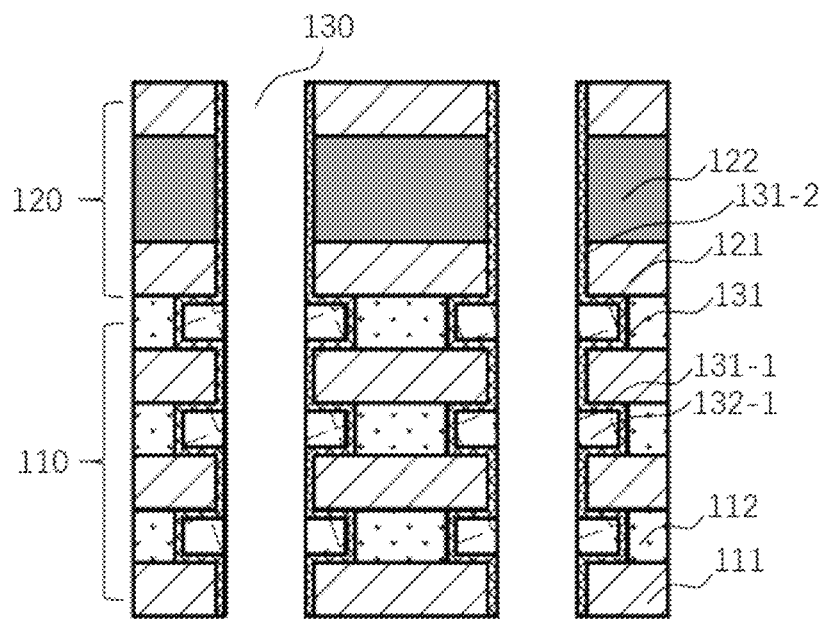
FIG. 7 is a local schematic diagram of a device structure after formation of a plurality of charge storage portions of a fabrication method of a three-dimensional memory according to Implementation I of the present application.

As shown in FIG. 6, after the formation of the blocking layers 131, continuous storage layers 132 may be formed on the first charge blocking portion 131-1 in each recess 103, and the second charge blocking portions 131-2 of sidewalls of the channel holes 130 using a suitable film deposition process, e.g., chemical vapor deposition (CVD), physical vapor deposition (PVD), atomic layer deposition (ALD) or any combination thereof. Exemplarily, in the recesses 103, spaces defined by the first charge blocking portions 131-1 may be fully filled with the storage layers 132. Then, part of the storage layers 132 located on the second charge blocking portions 131-2 may be removed by, for example, an anisotropic dry etching process, and part of the storage layers 132 in the recesses 103 is retained, thereby forming a plurality of discontinuous charge storage portions 132-1 as shown in FIG. 7. During operation of the three-dimensional memory, the plurality of discontinuous charge storage portions 132-1 can reduce a loss of charge stored therein due to diffusion in adjacent memory cells, thereby improving a data retention ability of the memory. Furthermore, the discontinuous charge storage portions 132-1 can improve a coupling effect of the memory cells caused by nonuniform electric field distribution, thereby improving the reliability of the three-dimensional memory.

Figure 8:
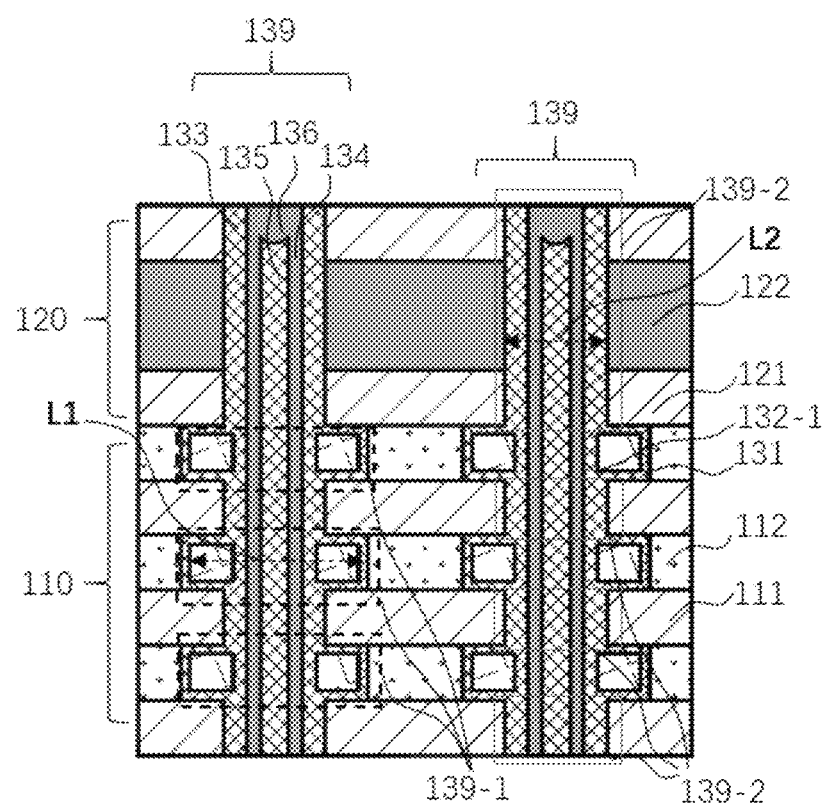
FIG. 8 is a local schematic diagram of a device structure after formation of channel structures of a fabrication method of a three-dimensional memory according to Implementation I of the present application.

As shown in FIG. 8, after the formation of the plurality of storage structures 132-1, the channel holes 130 may continue to be filled to form the channel structures 139. Exemplarily, tunneling layers 133, channel layers 134 and dielectric cores 135 may be formed in sequence on the second charge blocking portions 131-2 and the charge storage portions 132-1 along the sidewalls of the channel holes 130, wherein charge trapped by the storage structures 132-1 may be tunneled into the channel layers 134 through the tunneling layers 133 and transferred in the channel layers 134.

Exemplarily, a material for the tunneling layers 133 may comprise silicon oxide, silicon nitride and silicon oxynitride, and a material for the channel layers 134 may comprise one or more semiconductor materials, e.g., a single-element semiconductor material, a III-V compound semiconductor material, a II-VI compound semiconductor material and/or an organic semiconductor material. In some embodiments, the channel layers 134 may comprise polysilicon layers for promoting charge transfer. In some examples, the dielectric cores 135 may comprise a suitable dielectric material, for example, silicon oxide. As an example, the channel structures 139 corresponding to the first stack 110 may comprise a silicon oxide-silicon nitride-silicon oxide-silicon nitride-polysilicon (ONOP) structure.

As an option, the tunneling layers 133, the channel layers 134 and the dielectric cores 135 may be deposited in sequence towards centers of the channel holes 130 radially by a film deposition process, e.g., CVD, PVD, ALD or any combination thereof, wherein spaces defined by the channel layers 134 may be filled with the dielectric cores 135.

As shown in FIG. 8, part of the sacrificial layers 112 of the first stack 110 is removed to form the recesses 103 as shown in FIG. 4 between the adjacent first dielectric layers 111, while similar operation is not carried out for the second stack 120, so that after the channel structures 139 are formed in the recesses 103 and the channel holes 130 (FIG. 4), the channel structures 139 surrounded by the first stack 110 and the second stack 120 may have alternative and different radial dimensions.

Referring to FIG. 8 again, in some examples, first portions 139-1 of the channel structures 139 surrounded by the sacrificial layers 112 have a first radial dimension L1, and second portions 139-2 of the channel structures 139 surrounded by the second stack 120 and the first dielectric layers 111 have a second radial dimension L2, wherein L1 is greater than L2.

It should be noted that, for the purpose of clear illustration, the first portions 139-1 and the second portions 139-2 of the channel structure 139 are marked on two channel structures 139 with the same structure in the example of FIG. 8. For the same purpose, the first portions 139-1 and the second portions 139-2 are marked similarly in other exemplary figures herein. However, this does not cause any substantial influence to the protection scope of the present application.

It may be understood that, the channel structures 139 surrounded by the second stack 120 may not comprise a storage layer for storing charge. As an option, when the blocking layers 131 and the tunneling layers 133 comprise silicon oxide, the blocking layers 131 and the tunneling layers 133 may act as gate oxide layers of an MOS transistor.

In some implementations, channel plugs 136 may be further formed at tops of the channel holes 130 away from the substrate, and can increase a contact area and a process window for bit line contact landing.

In some implementations, after the formation of the channel structures 139, gate slits (not shown in FIG. 8) may be further formed in the stack structure, and for example, the gate slits may be formed vertically through the stack structure by, for example, an anisotropic dry etching process.

In some examples, the gate slits (not shown in FIG. 8) may comprise first gate slits and second gate slits, wherein the first gate slits may divide the stack structure into a plurality of block areas, and the second gate slits may, between the adjacent first gate slits, divide the block areas into a plurality of finger areas.

It is readily understood that, the gate slits may be formed at any suitable stage of the fabrication method of the three-dimensional memory, without departing from the teaching of the present disclosure.

Figure 10:
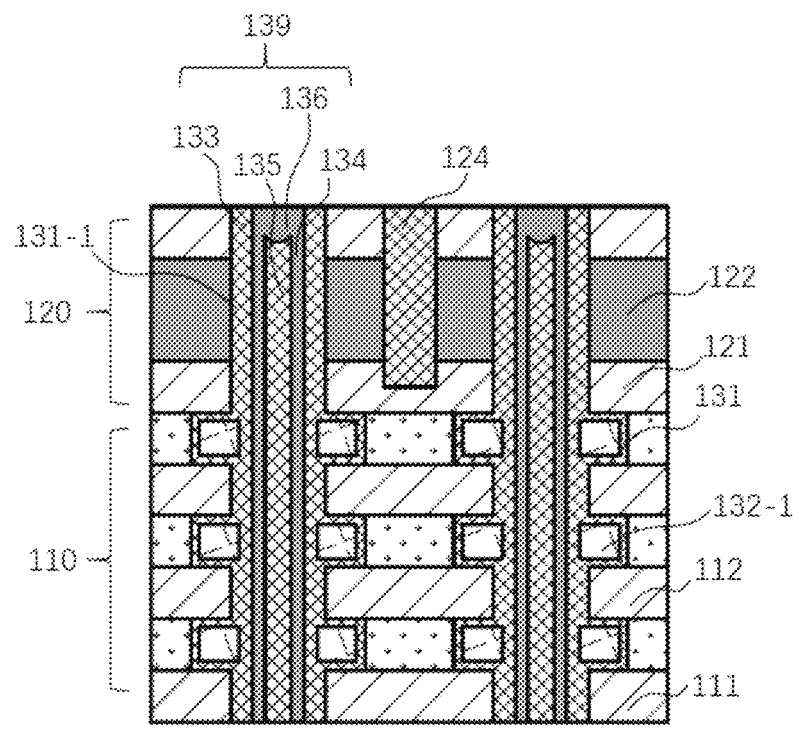
FIG. 10 is a local schematic diagram of a device structure after formation of an isolation structure of a fabrication method of a three-dimensional memory according to Implementation I of the present application.

Referring back to FIG. 1, the fabrication method of the memory according to some implementations of the present application proceeds to Operation S250, wherein an isolation structure 124 may be formed in the second stack 120, penetrates through the conductive layers 122 and runs through between the adjacent channel structures 139. FIG. 10 shows a corresponding structure.

Figure 9:
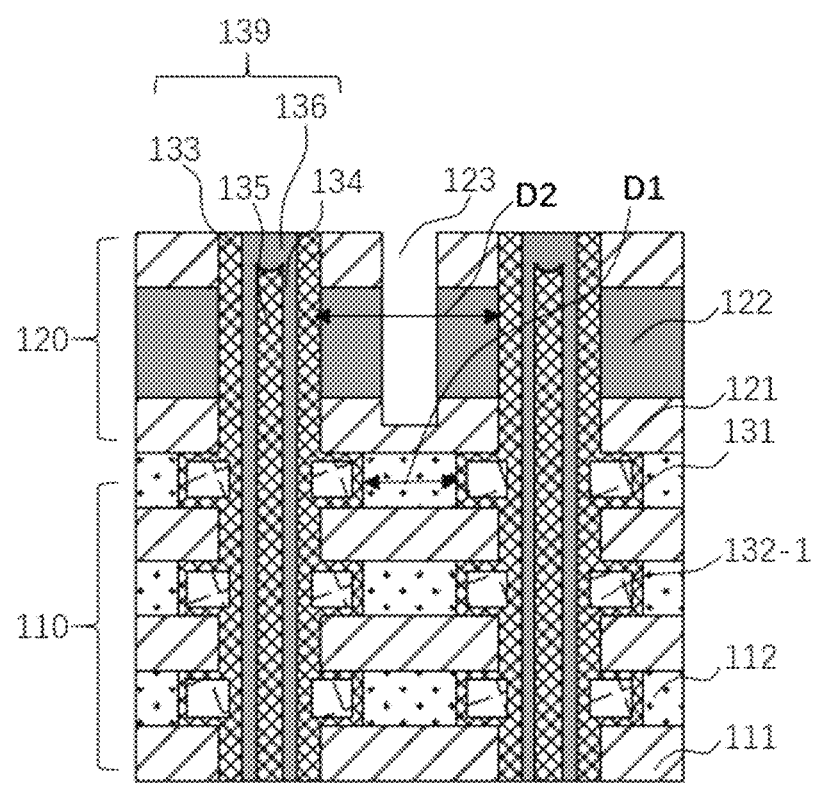
FIG. 9 is a local schematic diagram of a device structure after formation of an opening of a fabrication method of a three-dimensional memory according to Implementation I of the present application.

In an embodiment as shown in FIG. 9, after the formation of the channel structures 139, an opening 123 may be formed in the second stack 120 by, for example, an anisotropic dry etching process or an isotropic wet etching process, and the opening 123 may run through the second stack 120, and stops in the second dielectric layer 121 in contact with the first stack 110.

As compared with a two-dimensional memory, a three-dimensional stack structure is generally formed by alternately stacking a plurality of gate layers and dielectric layers in a three-dimensional memory. Arrayed channel structures may be formed in the stack structure, wherein memory cells are formed at intersections of the channel structures and the gate layers, and a plurality of memory cells constitute a memory string in a stacking direction.

Figure 11:
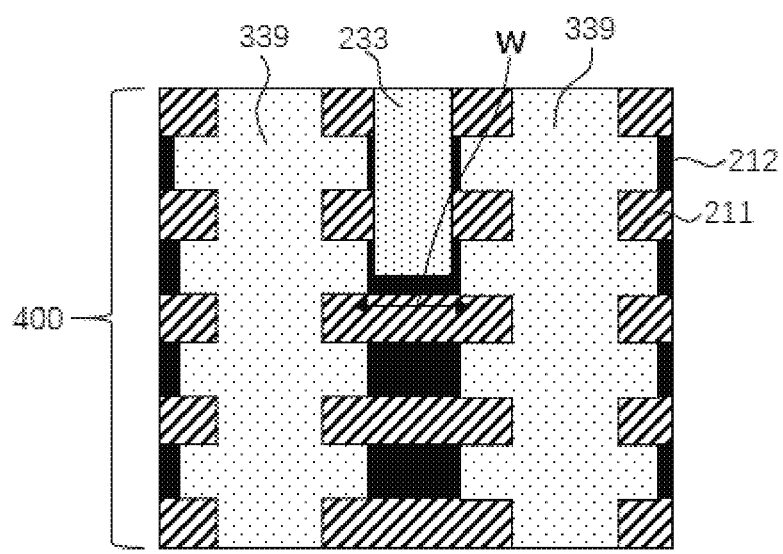
FIG. 11 is a local schematic diagram of forming an isolation structure before formation of channel holes of a fabrication method of a three-dimensional memory according to Implementation I of the present application.

In some implementations, as shown in FIG. 11, a three-dimensional memory may comprise a stack structure 400 which comprises alternative dielectric layers 211 and gate layers 212, and channel structures 339 formed through the dielectric layers 211 and the gate layers 212. As an option, at least one gate layer 212 located at a top of the stack structure 400 may act as a top select gate layer. By disposing a top select gate cut line 233, the top select gate layer may be partitioned, so that more precise control can be performed for a memory string of each partition.

In some examples, for example, 9 rows of channel structures 339 (a "row" direction is parallel to gate slits), also called as a "9-hole array", may be disposed in a finger area divided by two adjacent second gate slits (not shown in FIG. 11), and the "9-hole array" is controlled by a top select gate of the finger area.

In a memory plane with the same area, if the number of rows of the channel structures 339 (FIG. 11) is increased, the number of the second gate slits may be decreased obviously, and the number of the channel structures 339 (FIG. 11) with a memory function is increased, such that a memory density can be improved.

By increasing the "9-hole array" to a "12/15/16/19/24-hole array" or more, not only is the number of the second gate slits (not shown in FIG. 11) decreased, but also a distance between the second gate slits (not shown in FIG. 11) is increased; if, at that time, the top select gate cut line 233 is formed first, in a step of performing gate replacement, the top select gate cut line 233 may hinder diffusion of a gate material, thereby affecting the formation of the gate layers 212 on the two sides of the top select gate cut line. Therefore, a fabrication step of the top select gate cut line 233 is generally required to be moved after the step of the gate displacement. The step of forming the gate layers 212 generally comprises depositing a plurality of layers of different kinds of materials largely different from a material of the dielectric layers, for example, a high-K dielectric, TiN and W. During formation of an opening of the top select gate cut line 233, the above respective layers are required to be etched. Since the materials of the respective layers are largely different, and there are multiple kinds of materials and multiple stacks, it is difficult to etch selectively, such that a fabrication process of the top select gate cut line is difficult.

In some examples, as shown in FIG. 11, the channel structures 339 generally comprise ONOP (oxide-nitride-oxide-polysilicon) composite layers, and at least part of storage layers (not shown) of the channel structures 339 may be formed between the adjacent dielectric layers 211, so that the storage layers can be bent or disconnected to reduce or obstruct the diffusion of stored charge in the stacking direction, thereby improving a data retention ability of the memory. However, since part of space is occupied between the dielectric layers 212, wall thicknesses W at some positions between the adjacent channel structures 339 become small accordingly, leading to reduction of a process window of the top select gate cut line 233.

Figure 12:
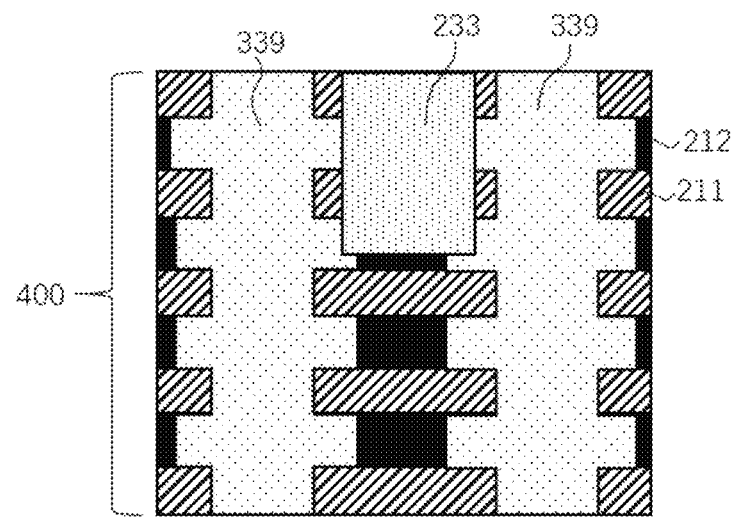
FIG. 12 is a local schematic diagram of a device structure after formation of conductor layers of a fabrication method of a three-dimensional memory according to Implementation I of the present application.

As shown in FIG. 12, in some implementations, to increase the process window of the top select gate cut line 233, part of the two adjacent rows of channel structures 339 may be occupied, and the two rows of channel structures 339 will not be electrically connected during subsequent operation of the three-dimensional memory.

Figure 13:
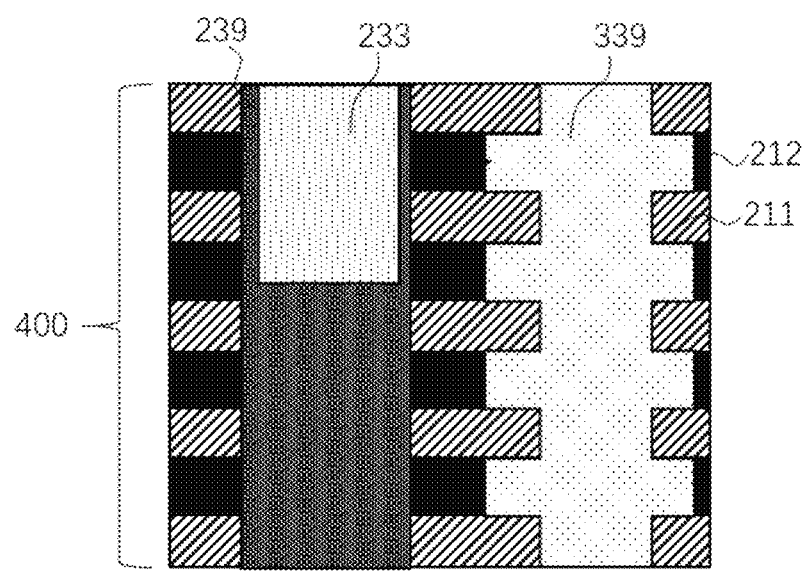
FIGS. 13-16 are local schematic diagrams of a device structure after formation of a top select gate cut line of a fabrication method of a three-dimensional memory according to some implementations of the present application.

As shown in FIG. 13, in some implementations, a row of dummy channel structure 239 (without a memory function) may be formed additionally for the top select gate cut line 233 to use.

Figure 14:
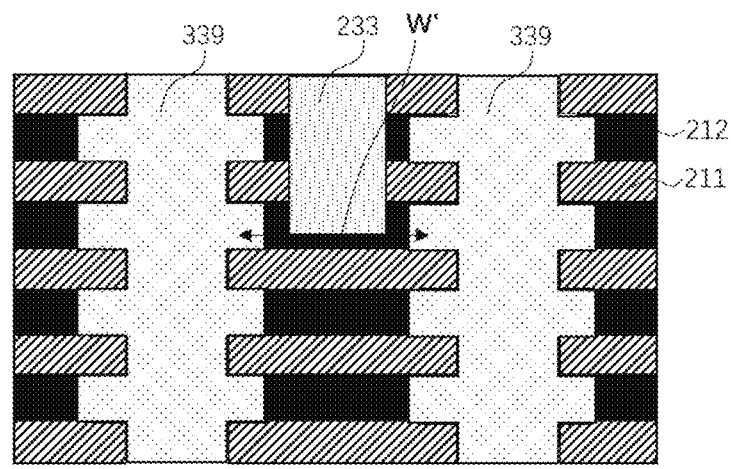

As shown in FIG. 14, in some implementations, a wall thickness between the adjacent memory channel structures 339 may also be increased, for example, the wall thickness is increased from W as shown in FIG. 11 to W' as shown in FIG. 14.

The above method of increasing the process window of the top select gate cut line 233 will lead to the decrease in the number of the channel structures 339, thereby resulting in a loss of memory density.

As mentioned before, for example, in some implementations comprising the first stack 110 and the second stack 120 as shown in FIG. 9, at the sacrificial layers 112 of the first stack 110, the wall thickness of the adjacent channel structures 139 becomes small, and the reduced wall thickness is D1, while in the second stack 120, the wall thickness D2 of the adjacent channel structures 139 is almost retained; when the opening 123 is formed through the second stack 120 with the wall thickness D2, its process window is almost not reduced. A process window of the isolation structure 124 may not necessarily be increased if certain process conditions are met, and the occurrence of occupation of part of the channel structures 139 or addition of a row of dummy channel structure or additional increase of the wall thickness between the adjacent channel structures 139 can be reduced to some extent. Therefore, the loss of the memory density can be reduced to some extent.

The thickness of the second stack 120 formed is relatively small, and a thickness range, for example, may be of a nanoscale, so that the opening 123 can be relatively easily formed by etching the second stack 120.

In some examples, the opening 123 may be filled with an insulating material to form the isolation structure 124 as shown in FIG. 10. The insulating material filled, for example, may comprise one or more of an oxide material (e.g., silicon oxide), a nitride material (e.g., silicon nitride), and an oxynitride (e.g., silicon oxynitride) material. As an option, planarization treatment may be carried out for a top surface of the isolation structure 124 using chemical mechanical polishing. In some examples, the isolation structure 124 may serve as a top select gate cut line to be disposed between the adjacent second gate slits to split the finger areas into multiple sub-areas to carry out more precise control for memory strings of the sub-areas.

Figure 15:
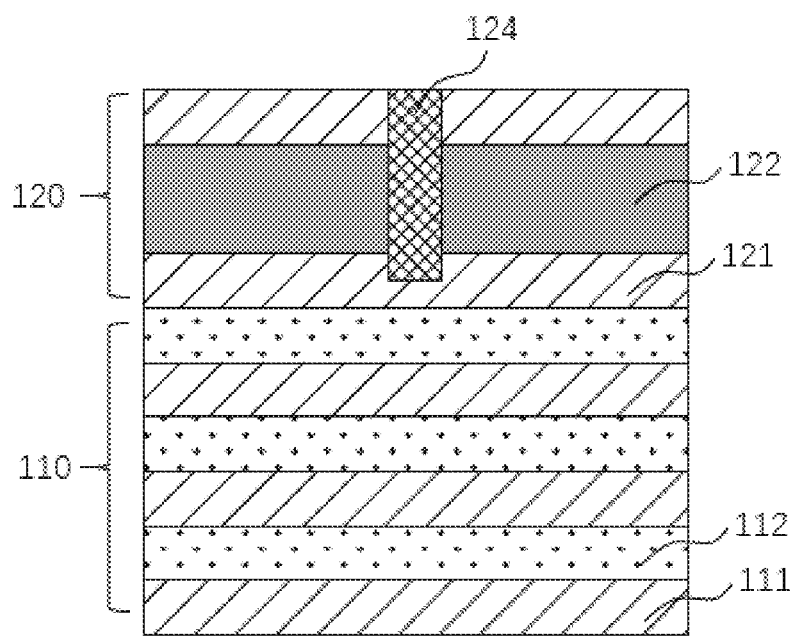

As shown in FIG. 15, in some embodiments, the isolation structure 124 may be formed in the second stack 120 after the formation of the first stack 110 and the second stack 120 and before the formation of the channel holes 130. In some implementations, to simplify the process, the channel holes 130 and the opening 123 may also be formed simultaneously by a suitable etching process.

Figure 16:
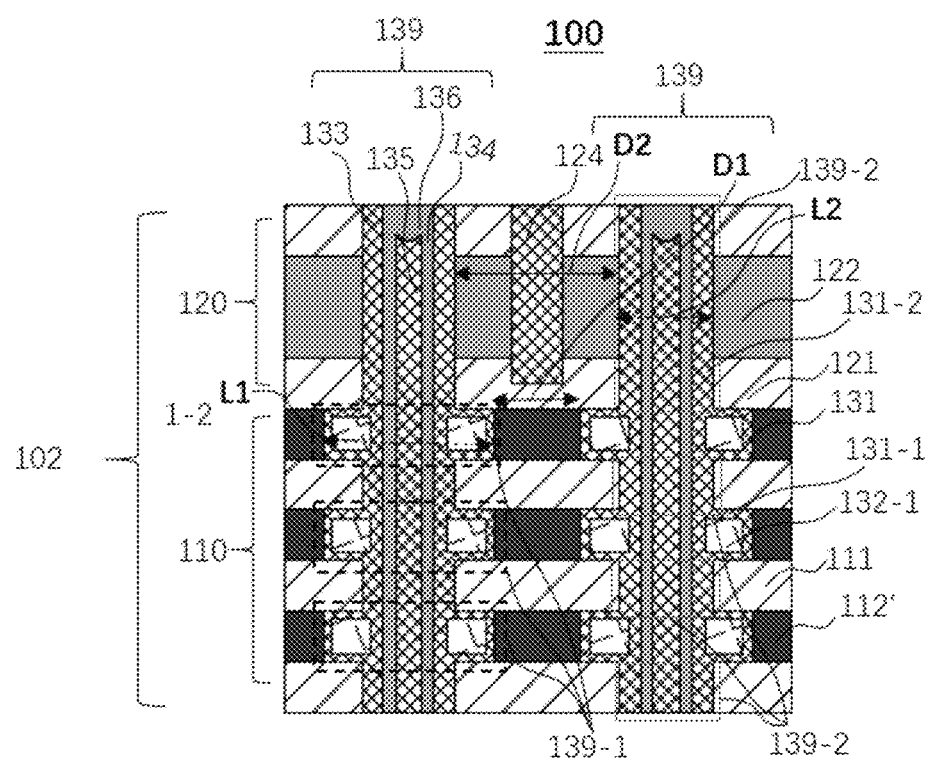

As shown in FIG. 16, in some embodiments, the remaining parts of the sacrificial layers 112 may be removed through the gate slits, and then conductor layers 112' are formed in spaces formed after the remaining parts of the sacrificial layers 112 are removed. In some examples, a material of the conductor layers 112' may be different from that the conductive layers 122, for example, the material of the conductor layer 112' may comprise a metal, such as W, Co, Cu, Al, Ti, Ta, Ni, etc., while the conductive layers may comprise a semiconductor material, such as P-type doped polysilicon, metal silicide, etc. In some other examples, the material of the conductor layers 112' and the material of the conductive layers 122 may be the same, for example, may both comprise a metal.

In some examples, for example, when the material of the conductor layers 112' and the material of the conductive layers 122 both comprise a metal, during formation of the opening 123, the second dielectric layers 121 and the conductive layers 122 may be etched alternately by selecting different etching gases, and the etching time is controlled, so that etching can stop in the second dielectric layer 121 in contact with the first stack 110.

In some implementations, before the formation of the conductor layers 112', at least one dielectric layer may be formed first to reduce leakage current of a word line and impurity diffusion of the conductor layers 112', for example, at least one TiN layer and at least one high-K dielectric layer may be formed, and then the conductor layers 112' are formed on the high-K dielectric layers.

Figure 17:
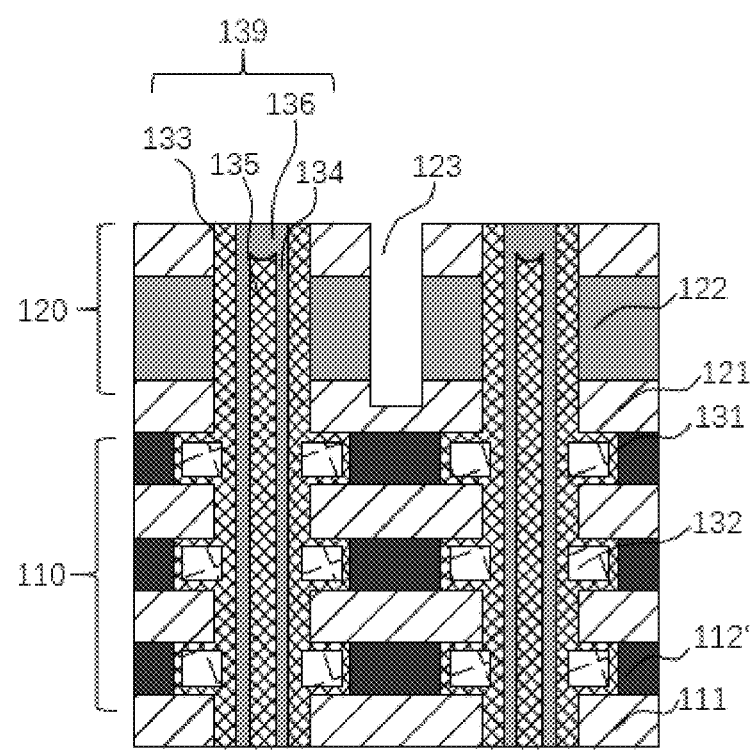
FIG. 17 is a local schematic diagram of forming an opening after formation of conductor layers of a fabrication method of a three-dimensional memory according to Implementation I of the present application.

In some implementations, as shown in FIG. 17, the opening 123 of the isolation structure 124 (FIG. 16) may be formed in the second stack 120 after the formation of the conductor layers 112'.

In some implementations, at suitable steps, the gate slits may be filled with insulating layers, and conductive paths may be formed in spaces defined by the insulating layers to form a gate slit structure, wherein the insulating layers may be used for electrically isolating the conductive layers 122 and the conductor layers 112' from the conductive paths respectively, and the conductive paths may serve as lead-out paths for electrical connection of a common source line.

For the fabrication method provided by the implementations of the present application, since the conductive layers 122 serving as the top select gate layers are formed by a direct deposition process, the isolation structure 124 may be formed at any suitable step under a multi-hole array (exceeding "9-hole array") structure, thereby avoiding limitations to a formation process of the isolation structure 124 caused by the formation of the conductive layers 122 by the gate displacement process.

The implementation of another aspect of the present application further provides a three-dimensional memory 100. As shown in FIG. 16, the three-dimensional memory 100 comprises a substrate (not shown in the figure), a stack structure 102 formed on the substrate, and a plurality of channel structures 139 and an isolation structure 124 which are formed in the stack structure 102, and the isolation structure 124 may be disposed between the adjacent channel structures 139.

In some examples, a fabrication material of the substrate may be chosen from any suitable semiconductor materials, for example, monocrystalline silicon, polysilicon, monocrystalline germanium (Ge), silicon germanium (GeSi), silicon carbide (SiC), silicon on insulator (SOI), germanium on insulator (GOI), or III-V compounds, such as gallium arsenide, etc.

As shown in FIG. 16, in some implementations, the stack structure 102 comprises a first stack 110 and a second stack 120 that are formed in sequence on the substrate; the first stack 110 comprises first dielectric layers 111 and conductor layers 112' (also called as "control gate layers") which are stacked alternately; the second stack 120 comprises second dielectric layers 121 and conductive layers 122 (also called as "top select gate layers") which are stacked alternately, wherein the second stack 120 and the first stack 110 are stacked in the same stacking direction.

In some examples, the first stack 110 may comprise a plurality of pairs of first dielectric layers 111/sacrificial layers 112, and the number of the pairs may be selected according to various application scenes. In some examples, a material of the first dielectric layers 111, for example, may comprise silicon oxide, silicon nitride, silicon oxynitride, organosilicate glass (OSG), a spin-coating dielectric material, a dielectric metal oxide generally known as a high dielectric constant (high k) dielectric oxide and silicate thereof, dielectric metal oxynitride and silicate thereof, and an organic insulating material. As an example, the first dielectric layers 111, for example, may comprise silicon oxide, and the sacrificial layers 112 may comprise silicon nitride.

In some examples, the second stack 120 may comprise at least one pair of second dielectric layer 121/conductive layer 122, and the number of the pairs may be less than that of the pairs of first dielectric layers 111/sacrificial layers 112. As an example, the number of the pairs of second dielectric layer 121/conductive layer 122, for example, may be 1, 2, 4 or more.

In some examples, the second stack 120 is relatively thin, and a thickness range, for example, may be of a nanoscale.

In some examples, the conductive layers 122 may comprise a semiconductor material which, for example, may comprise polysilicon or metal silicide. As an option, the conductive layers 122, for example, may comprise P-type doped (e.g., boron-doped) polysilicon such that a threshold voltage of a top select gate transistor is positive when the conductive layers 122 serve as the top select gate layers, thereby turning off a controlled channel.

In some examples, a conductive material of the conductive layers 122 may comprise a metal, such as W, Co, Cu, Al, Ti, Ta, Ni, etc., which has such a work function that a threshold voltage of a top select gate transistor is positive when the conductive layers 122 serve as the top select gate layers, thereby turning off a controlled channel.

In some examples, a material of the conductor layers 112' may be different from that of the conductive layers 122. For example, the material of the conductor layer 112', for example, may comprise a metal, such as W, Co, Cu, Al, Ti, Ta, Ni, etc., while the conductive layers 122, for example, may comprise a semiconductor material, such as P-type doped polysilicon, metal silicide, etc.

In some other examples, the material of the conductor layers 112' and the material of the conductive layers 122 may be the same, for example, may both comprise a metal.

In some examples, a material of the second dielectric layers 121 may be the same as that of the first dielectric layers 111.

In some implementations, a staircase structure (not shown in FIG. 16) may be formed on the two sides or in a position near the middle of the stack structure 102 to lead out word lines.

As shown in FIG. 16, in some implementations, the channel structures 139 comprise a plurality of first portions 139-1 formed by surrounding of the conductive layers 122 in a circumferential direction, and a plurality of second portions 139-2 surrounded by the second stack 120 and the first dielectric layers 111 in the circumferential direction.

In some examples, between the adjacent first dielectric layers 111, each first portion 139-1 comprises first charge blocking portions 131-1 and charge storage portions 132-1. Exemplarily, each first charge blocking portion 131-1 may cover inner walls surrounded by the adjacent first dielectric layers 111 and the conductor layers 112' therebetween. As an option, the plurality of charge storage portions 132-1 may be disposed discontinuously in a stacking direction, wherein each charge storage portion 132-1 may cover sidewalls of the first charge blocking portions 131-1.

During operation of the three-dimensional memory, the plurality of discontinuous charge storage portions 132-1 can reduce a loss of charge stored therein due to diffusion in adjacent memory cells, thereby improving a data retention ability of the three-dimensional memory. Furthermore, the discontinuous charge storage portions 132-1 can improve a coupling effect of the memory cells caused by nonuniform electric field distribution, thereby improving the reliability of the three-dimensional memory.

In some implementations, the second portions 139-2 may comprise a plurality of second charge blocking portions 131-2 disposed in sequence on sidewalls of the second stack 120 and the first dielectric layers 111, wherein the first charge blocking portions 131-1 of the first portions 139-1 and the second charge blocking portions 131-2 of the second portions 139-2 constitute continuous blocking layers 131. Exemplarily, a material for the blocking layers 131 may comprise silicon oxide, silicon nitride, silicon oxynitride, and a high-K dielectric material such as aluminum oxide or hafnium oxide.

In some embodiments, the first portions 139-1 and the second portions 139-2 may further comprise tunneling layers 133, channel layers 134 and dielectric cores 135 which are disposed in sequence on sidewalls of the charge storage portions 132-1 and the second charge blocking portions 131-2 respectively, and spaces defined by the channel layers 134 may be filled with the dielectric cores 135, wherein charge trapped by the charge storage portions 132-1 may be tunneled into the channel layers 134 through the tunneling layers 133 and transferred in the channel layers 134.

Exemplarily, a material for the tunneling layers 133 may comprise silicon oxide, silicon nitride and silicon oxynitride, and a material for the channel layers 134 may comprise one or more semiconductor materials, e.g., a single-element semiconductor material, a III-V compound semiconductor material, a II-VI compound semiconductor material and/or an organic semiconductor material. In some embodiments, the channel layers 134 may comprise polysilicon layers for promoting charge transfer. In some examples, the dielectric cores 135 may comprise a suitable dielectric material, for example, silicon oxide. As an example, the channel structures 139 corresponding to the first stack 110 may comprise a silicon oxide-silicon nitride-silicon oxide-silicon nitride-polysilicon (ONOP) structure.

It may be understood that, the channel structures 139 surrounded by the second stack 110 may not comprise a storage layer for storing charge. As an option, when the blocking layers 131 and the tunneling layers 133 comprise silicon oxide, the blocking layers 131 and the tunneling layers 133 may act as gate oxide layers of an MOS transistor.

Exemplarily, channel plugs 136 may be further formed at tops of the channel structures 139 away from the substrate, and can increase a contact area and a process window for bit line contact landing.

Referring to FIG. 16 again, in some embodiments, the plurality of first portions 139-1 of the channel structures 139 surrounded by the conductor layers 112' have a first radial dimension L1, and the second portions 139-2 of the channel structures 139 surrounded by the second stack 120 and the first dielectric layers 111 have a second radial dimension L2, wherein the first radial dimension L1 is greater than the second radial dimension L2. Consequently, in the second stack 120, the adjacent channel structures 139 have a wall thickness D2 therebetween; in the first stack 110, the adjacent channel structures 139 have a different and alternative wall thickness therebetween; for example, at the first dielectric layers 111, the adjacent channel structures may have the wall thickness D2 therebetween, while at the conductor layers 112', the adjacent channel structures 139 have a wall thickness D1 therebetween, wherein D2 is greater than D1.

In some implementations, the three-dimensional memory 100 further comprises a gate slit structure (not shown in FIG. 16) which penetrates through the second stack 120 and the first stack 110. In some examples, the gate slit structure comprises insulating layers filled in the gate slits penetrating through the second stack 120 and the first stack 110, and conductive paths formed in spaces defined by the insulating layers, wherein the insulating layers may be used for electrically isolating the conductive layers 122 and the conductor layers 112' from the conductive paths respectively, and the conductive paths may serve as lead-out paths for electrical connection of a common source line.

In some implementations, the isolation structure 124 may penetrate through the conductive layers 122 and is located between the adjacent channel structures 139, and stops in the second dielectric layer 121 in contact with the first stack 110. As an example, the isolation structure 124 may comprise an insulating material filled in an opening formed through the second stack 120, and the insulating material filled comprises one or more of an oxide material (e.g., silicon oxide), a nitride material (e.g., silicon nitride), and an oxynitride (e.g., silicon oxynitride) material.

In some examples, the isolation structure 124 may serve as a top select gate cut line to be disposed between the adjacent second gate slits (not shown in FIG. 16) to split the finger areas into multiple sub-areas to carry out more precise control for memory strings of the sub-areas.

Implementation II

A fabrication method of a memory according to Implementation II comprises Operation S210, Operation S220 and Operation S230, as shown in FIG. 1. The Operations S210, S220 and S230 in Implementation II are the same as the treatment of forming a first stack 110 and a second stack 120 (FIG. 2), the step of forming channel holes 130 (FIG. 3) by penetrating through the first stack 110 and the second stack 120, and the process of removing at least part of respective sacrificial layers 112 from the first stack 110 through the channel holes 130 to form recesses 103 (FIG. 4) between every adjacent first dielectric layers 111 in the first stack 110 in above Implementation I. Thus, their detailed description is omitted.

Figures 18, 19:
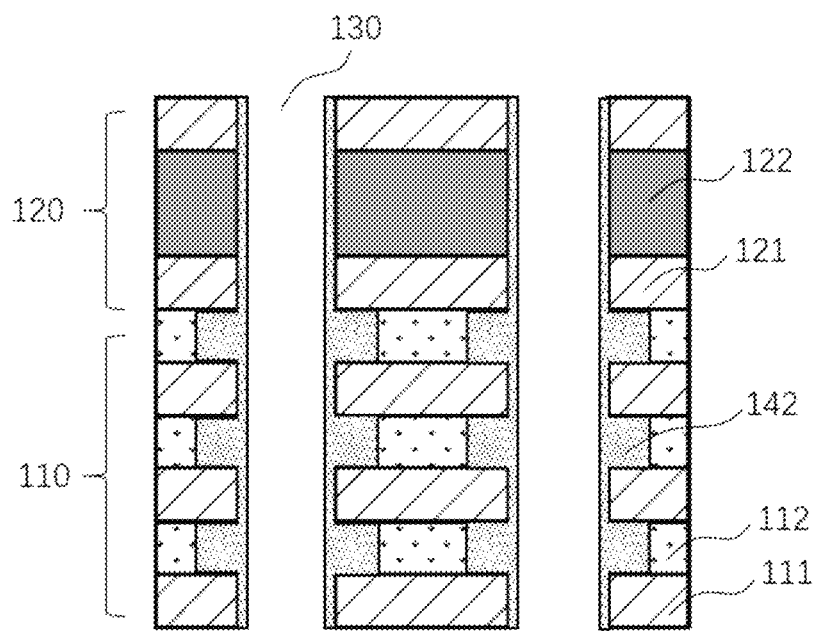
FIG. 18 is a step flow diagram of forming a plurality of discontinuous charge storage portions and a plurality of discontinuous charge blocking portions in recesses in a fabrication method of a three-dimensional memory according to Implementation II of the present application.
FIG. 19 is a local schematic diagram of a device structure after formation of continuous storage layers of a fabrication method of a three-dimensional memory according to Implementation II of the present application.

As shown in FIG. 1, the fabrication method of the memory according to the implementation further comprises Operation S240 to form channel structures 139 (FIGS. 19-26) in the recesses 103 (FIG. 4) and the channel holes 130 (FIG. 19). In this operation, a plurality of discontinuous charge storage portions and a plurality of discontinuous charge blocking portions may be formed in the respective recesses. FIG. 18 illustrates a flow diagram of Step 300 of forming a plurality of discontinuous charge storage portions and a plurality of discontinuous charge blocking portions in the recesses. FIGS. 19-26 illustrate schematic diagrams of respective stages of forming the charge storage portions.

Figure 20:
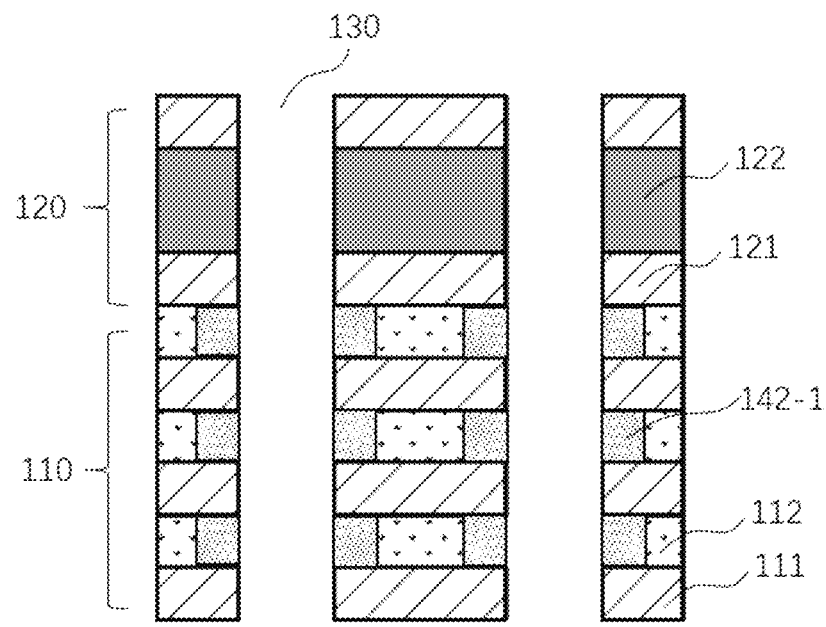
FIG. 20 is a local schematic diagram of a device structure after formation of a plurality of initial storage structures of a fabrication method of a three-dimensional memory according to Implementation II of the present application.

Referring to FIG. 19, for Operation S310 in Step 300, a plurality of initial charge storage portions may be formed in the respective recesses. FIG. 20 illustrates a corresponding structure.

As shown in FIG. 19, in some embodiments, continuous storage layers 142 may be formed in the recesses 103 (FIG. 4), and on sidewalls of the second stack 120 and the first dielectric layers 111 along the channel holes 130 using a suitable film deposition process, e.g., chemical vapor deposition (CVD), physical vapor deposition (PVD), atomic layer deposition (ALD) or any combination thereof, and then part of the storage layers 142 along sidewalls of the channel holes 130 may be removed to form a plurality of mutually discontinuous initial charge storage portions 142-1 as shown in FIG. 20. Exemplarily, spaces defined by the recesses 103 (FIG. 4) may be fully filled with the storage layers 132.

During operation of the three-dimensional memory, the plurality of discontinuous initial charge storage portions 142-1 can reduce a loss of charge stored therein due to diffusion in adjacent memory cells, thereby improving a data retention ability of the memory. Furthermore, the discontinuous initial charge storage portions 142-1 can improve a coupling effect of the memory cells caused by nonuniform electric field distribution, thereby improving the reliability of the three-dimensional memory.

The initial charge storage portions 142-1 can store the charge to carry out storage operation. Therefore, the requirements on film quality of 142-1 are high. In some examples, to form storage layers with low roughness and high density, an atomic level deposition process, for example, an atomic layer deposition process, is generally employed.

Figure 21:
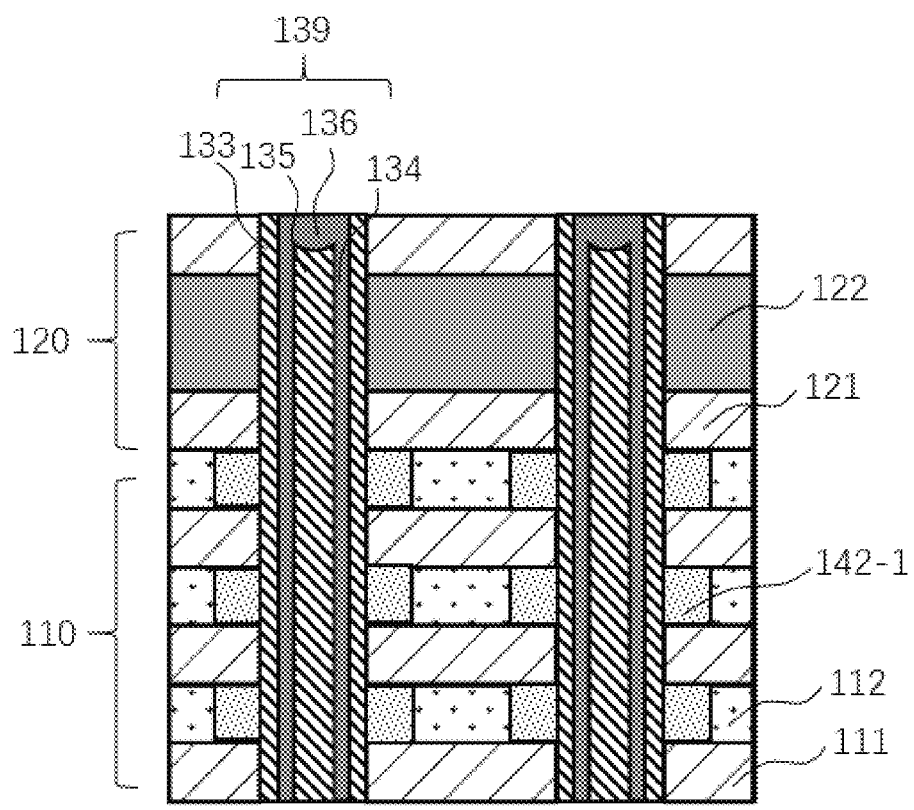
FIG. 21 is a local schematic diagram of a device structure formed after filling of channel holes of a fabrication method of a three-dimensional memory according to Implementation II of the present application.

As shown in FIG. 21, in some implementations, after the formation of the initial charge storage portions 142-1, in the channel holes 130, tunneling layers 133, channel layers 134 and dielectric cores 135 may be deposited in sequence towards centers of the channel holes 130 along sidewalls of the channel holes 130, and spaces defined by the channel layers 134 may be filled with the dielectric cores 135, wherein charge trapped by the charge storage portions 132-1 may be tunneled into the channel layers 134 through the tunneling layers 133 and transferred in the channel layers 134.

Exemplarily, the tunneling layers 133, the channel layers 134 and the dielectric cores 135 may be formed using the same deposition process and materials as those in Implementation I. It is not described redundantly here.

As shown in FIG. 21, in some implementations, channel plugs 136 may be further formed at tops of the channel holes 130 (FIG. 20) away from the substrate, and can increase a contact area and a process window for bit line contact landing.

In some implementations, at a suitable step, for example, when forming the channel holes 130, gate slits (not shown in the figure) parallel to the channel holes 130 may be formed in the stack structure simultaneously, and may penetrate through the stack structure vertically. It is readily understood that, the gate slits may be formed at any suitable stage of the fabrication method of the three-dimensional memory, without departing from the teaching of the present disclosure.

Figure 22:
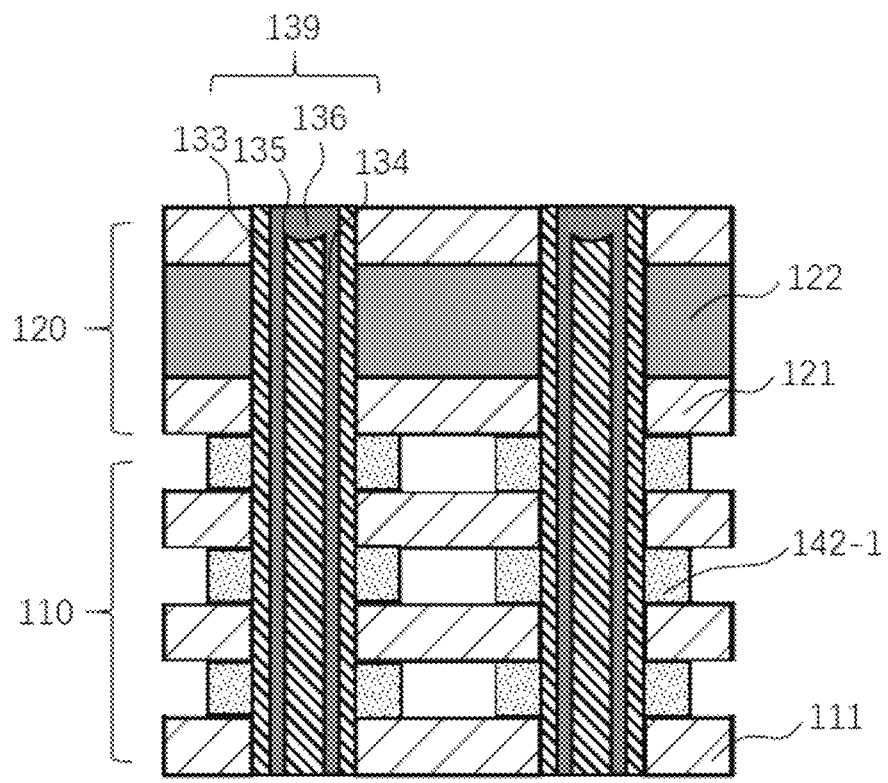
FIG. 22 is a local schematic diagram of a device structure after exposure of a plurality of initial charge storage portions of a fabrication method of a three-dimensional memory according to Implementation II of the present application.

Referring back to FIG. 18, for Operation S320 in Step 300, the remaining parts of the sacrificial layers may be removed to expose the initial charge storage portions on the sides away from the channel holes. FIG. 22 illustrates a corresponding structure.

As shown in FIG. 22, in some implementations, after the channel holes 130 are filled, the remaining parts of the sacrificial layers 112 may be removed through the gate slits (not shown in FIG. 22) to expose sidewalls of the plurality of initial storage structures 142-1 on the sides away from the channel holes 130 (FIG. 20). Meanwhile, the rest of top surfaces and bottom surfaces of the first dielectric layers 111 may also be exposed, so that the adjacent first dielectric layers 111 and the initial storage structures 142-1 therebetween form sacrificial spaces that are perpendicular to and communicated with the gate slits.

In some implementations, the sacrificial layers 112 have a higher etching selectivity than the initial charge storage portions 142-1 to permit retention of the initial charge storage portions 142-1 when the remaining parts of the sacrificial layers 112 are removed. Exemplarily, a process for removing the remaining parts of the sacrificial layers 112 may comprise isotropic wet etching. Under the same wet etching process, the sacrificial layers 112 have a higher etching selectivity than the initial charge storage portions 142-1, so that the initial charge storage portions 142-1 are almost not damaged.

In some implementations, the sacrificial layers 112 and the initial charge storage portions 142-1 may both comprise silicon nitride; under the condition of ensuring that a nitrogen-silicon ratio of the initial charge storage portions 142-1 can achieve better storage performance, a nitrogen-silicon ratio in the sacrificial layers 112 may be adjusted to have a larger difference from that of the initial charge storage portions 142-1, thereby permitting selective etching.

In some examples, silicon nitride which the sacrificial layers 112 and the initial charge storage portions 142-1 comprise may also be doped to change element types, thereby permitting selective etching.

In some implementations, etch stop layers made of a different material from that of the initial charge storage portions 142-1 and the sacrificial layers 112 may also be formed between the initial charge storage portions 142-1 and the sacrificial layers 112. As an option, the sacrificial layers 112 are made to have a higher etching selectivity than the etch stop layers to permit to stop at the etch stop layers when the remaining parts of the sacrificial layers 112 are removed by etching, thereby reducing a loss of the initial charge storage portions 142-1.

Figure 23:
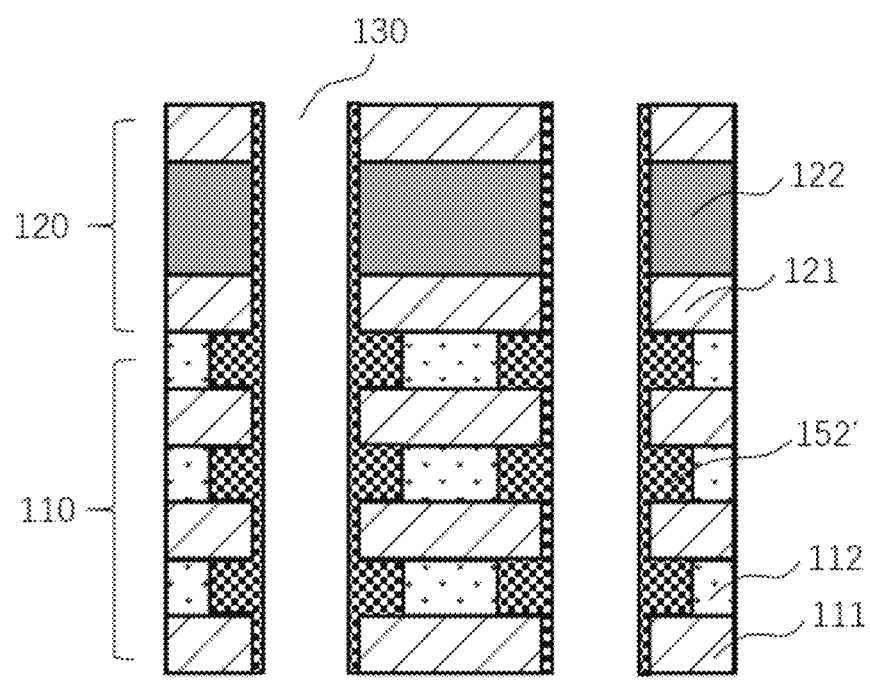
FIG. 23 is a local schematic diagram of a device structure after formation of initial etch stop layers of a fabrication method of a three-dimensional memory according to Implementation II of the present application.
Figure 24:
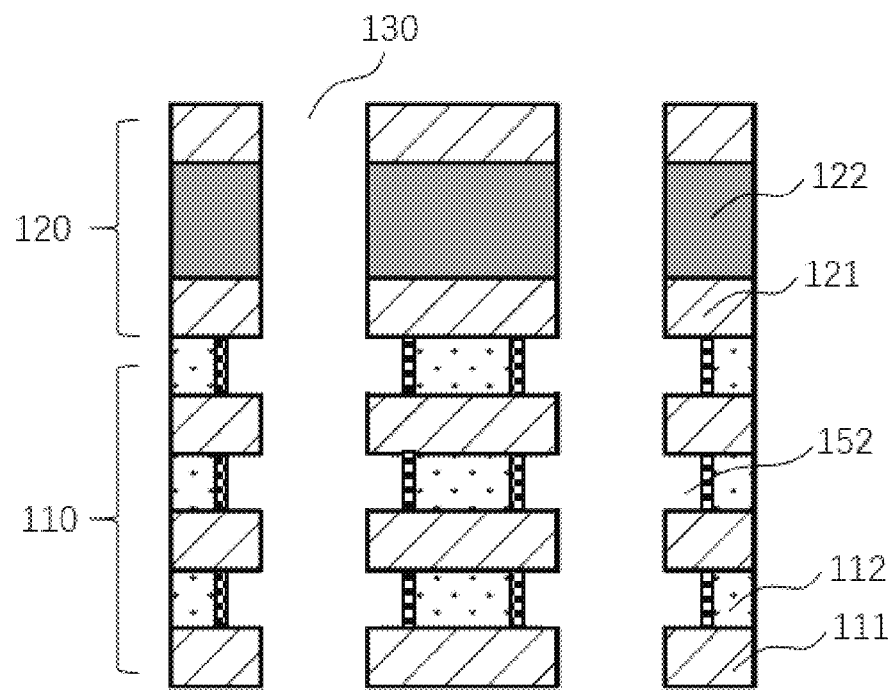
FIG. 24 is a local schematic diagram of a device structure after formation of etch stop layers of a fabrication method of a three-dimensional memory according to Implementation II of the present application.

As shown in FIG. 23, in some examples, to form the above etch stop layers, initial etch stop layers 152' may be formed in the recesses 103 and the channel holes 130 first, then portions of the initial etch stop layers 152' located on the sidewalls of the channel holes 130 are removed, and part of the initial etch stop layers 152' in the recesses are removed, while part of the initial etch stop layers 152' located on inner walls of the sacrificial layers 112 are retained, thereby forming the etch stop layers 152 as shown in FIG. 24.

Figure 25:
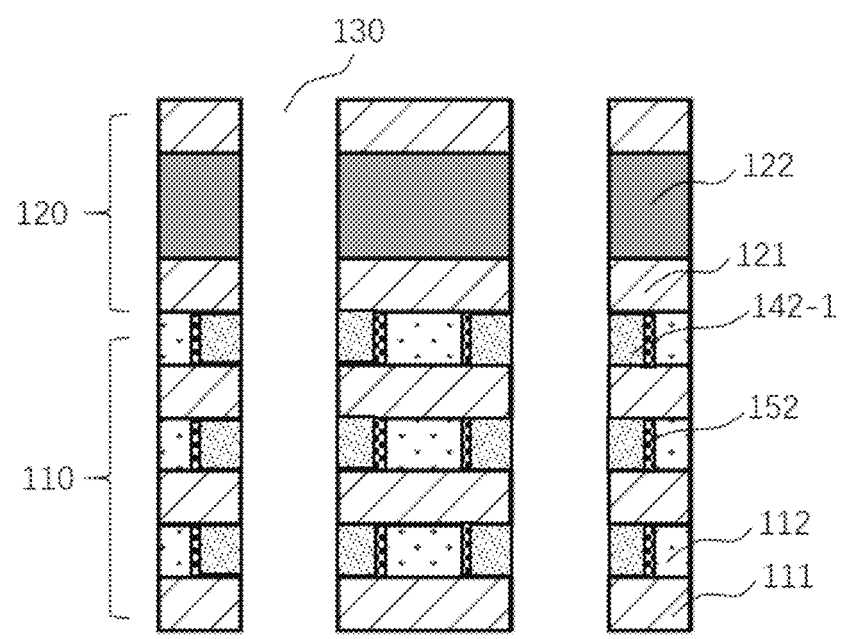
FIG. 25 is a local schematic diagram of a device structure after formation of a plurality of initial charge storage portions on etch stop layers of a fabrication method of a three-dimensional memory according to Implementation II of the present application.

As shown in FIG. 25, in some examples, after the formation of the etch stop layers 152, the initial charge storage portions 142-1 covering sidewalls of the etch stop layers 152 may be formed in the remaining spaces of the recesses, and in the stacking direction, the plurality of initial charge storage portions 142-1 are disposed discontinuously.

Figure 26:
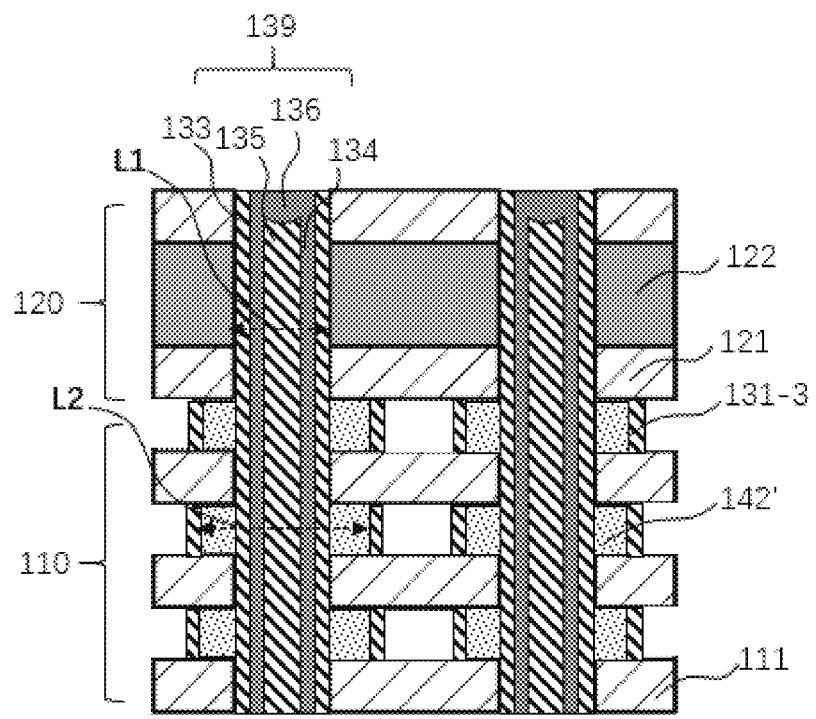
FIG. 26 is a local schematic diagram of a device structure formed after formation of a plurality of charge blocking portions of a fabrication method of a three-dimensional memory according to Implementation II of the present application.

Referring back to FIG. 18, Step 300 proceeds to Operation S330 to oxidize at least part of the exposed initial charge storage portions to discontinuous charge blocking portions. FIG. 26 illustrates a corresponding structure.

In some implementations, for example, in an example as shown in FIG. 22, after the formation of the sacrificial spaces, part of the plurality of initial charge storage portions 142-1 away from the channel holes may be oxidized to a plurality of first charge blocking portions 131-3, thereby forming the channel structures 139 as shown in FIG. 26, wherein the remaining parts of the initial charge storage portions 142-1 may serve as final charge storage portions 142'. Exemplarily, part of the plurality of initial charge storage portions 142-1 (e.g., silicon nitride) away from the channel holes may be oxidized to the plurality of first charge blocking portions 131-3 (e.g., silicon oxide or silicon oxynitride) by thermal oxidation and/or chemical oxidation treatment through the gate slits (not shown in FIG. 26), and the discontinuous charge storage portions 142' are formed. For example, the thermal oxidation may comprise an in-situ steam method which generates water in a form of steam using oxygen and hydrogen. As an option, the channel structures 139 may comprise a silicon-oxide-nitride-oxide (SONO) structure.

In some implementations, for example, in an example comprising the etch stop layers 152 as shown in FIG. 25, the remaining parts of the sacrificial layers 112, and the etch stop layers 152 may be removed in sequence using a suitable etching process, thereby exposing the sidewalls of the plurality of initial storage structures 142-1 as shown in FIG. 22 on the sides away from the channel holes 130.

As shown in FIG. 26, part of the sacrificial layers 112 (FIG. 4) of the first stack 110 are removed to form the recesses 103 (FIG. 4) between the adjacent first dielectric layers 111, while similar operation is not carried out for the second stack 120, so that after the channel structures 139 are formed in the recesses 103 (FIG. 4) and the channel holes 130 (FIG. 4), the channel structures 139 surrounded by the first stack 110 and the second stack 120 may have alternative and different radial dimensions. Referring to FIG. 26 again, in some examples, the channel structures 139 may have an alternative first radial dimension L1 and a second radial dimension L2, wherein L1 is greater than L2.

It may be understood that, the channel structures 139 surrounded by the second stack 110 may not comprise a storage layer for storing charge. As an option, when the first charge blocking portions 131-3 and the tunneling layers 133 comprise silicon oxide, the plurality of first charge blocking portions 131-3 and the tunneling layers 133 may act as gate oxide layers of an MOS transistor.

Figure 27:
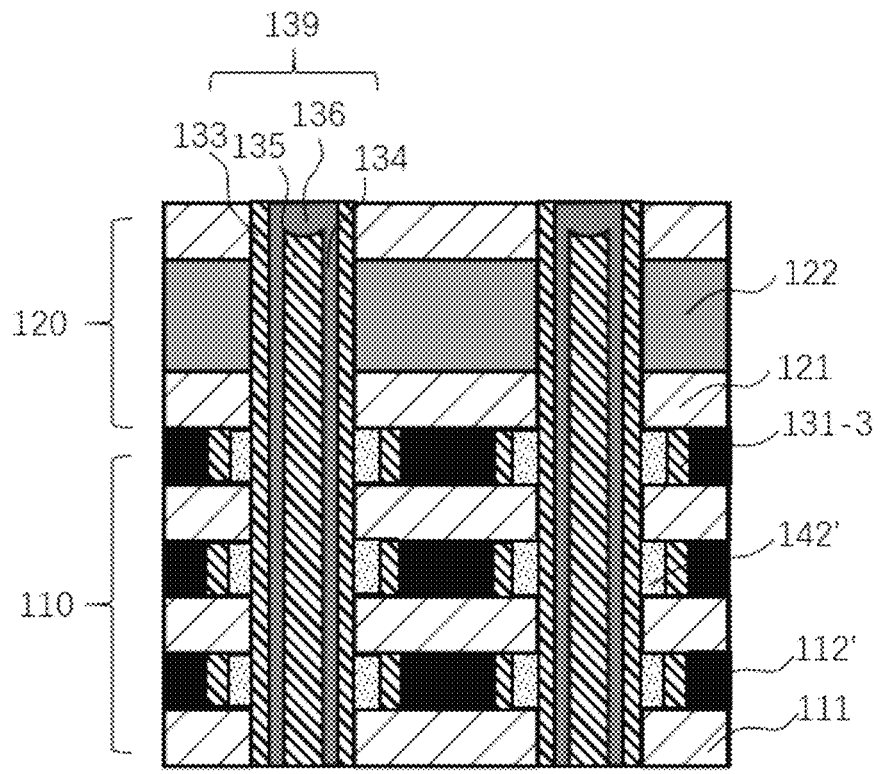
FIG. 27 is a local schematic diagram of a device structure formed after formation of conductor layers of a fabrication method of a three-dimensional memory according to Implementation II of the present application.

As shown in FIG. 27, in some implementations, conductor layers 112' may be formed in the sacrificial spaces through the gate slits. In some examples, a material of the conductor layers 112' may be different from that of the conductive layers 122, for example, the material of the conductor layer 112' may comprise a metal, such as W, Co, Cu, Al, Ti, Ta, Ni, etc., while the conductive layers may comprise a semiconductor material, such as P-type doped polysilicon, metal silicide, etc. In some other examples, the material of the conductor layers 112' and the material of the conductive layers 122 may be the same, for example, may both comprise a metal.

The first charge blocking portions 131-3 formed by implementations of the present application do not occupy spaces of the conductor layers 112' in the stacking direction, and under the same stacking height, more layers of the first dielectric layers 111 and the conductor layers 112' can be stacked, thereby increasing a memory capacity. Moreover, film density and uniformity of the first charge blocking portions 131-3 formed by oxidizing the initial charge storage portions 142-1 are better, so that the leakage of charge can be reduced effectively.

In some implementations, before the formation of the conductor layers 112', at least one dielectric layer may be formed first to reduce leakage current of a word line and impurity diffusion of the conductor layers 112', for example, at least one TiN layer and at least one high-K dielectric layer may be formed, and then the conductor layers 112' are formed on the high-K dielectric layers.

In some implementations, at suitable steps, the gate slits may be filled with insulating layers, and conductive paths may be formed in spaces defined by the insulating layers to form a gate slit structure, wherein the insulating layers may be used for electrically isolating the conductive layers 122 and the conductor layers 112' from the conductive paths respectively, and the conductive paths may serve as lead-out paths for electrical connection of a common source line.

Figure 29:
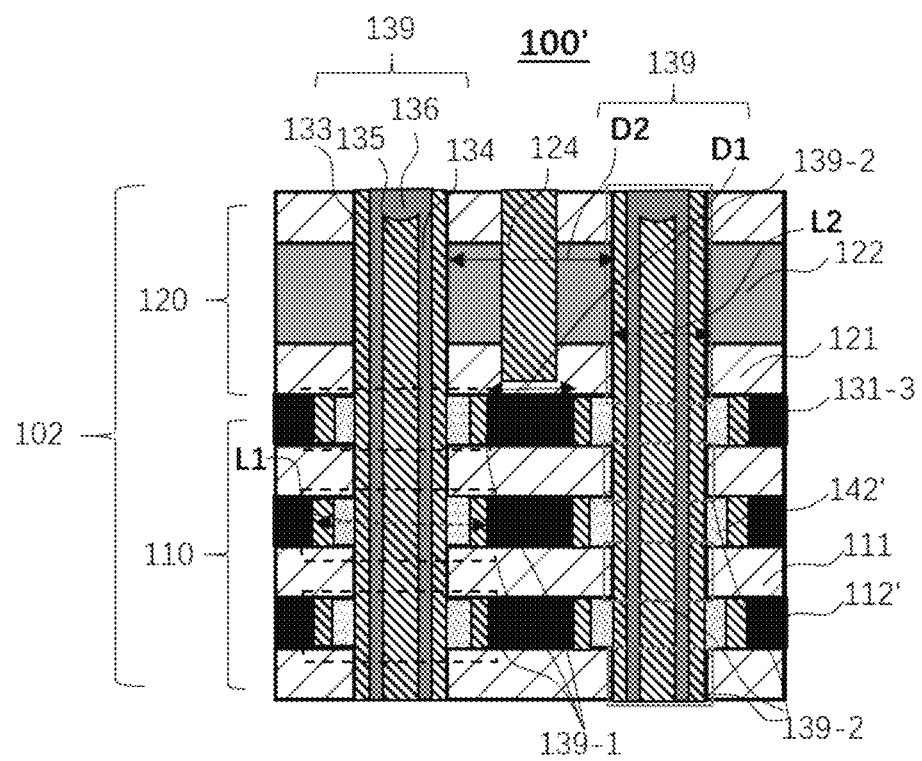
FIG. 29 is a local schematic diagram of a device structure after formation of an isolation structure of a fabrication method of a three-dimensional memory according to Implementation II of the present application.

The fabrication method of the memory according to Implementation II comprises Operation S250, as shown FIG. 1, an isolation structure 124 may be formed in the second stack 120, wherein the isolation structure 124 may penetrate through the conductive layers 122 and be located between the adjacent channel structures 139. FIG. 29 shows a corresponding structure.

Figure 28:
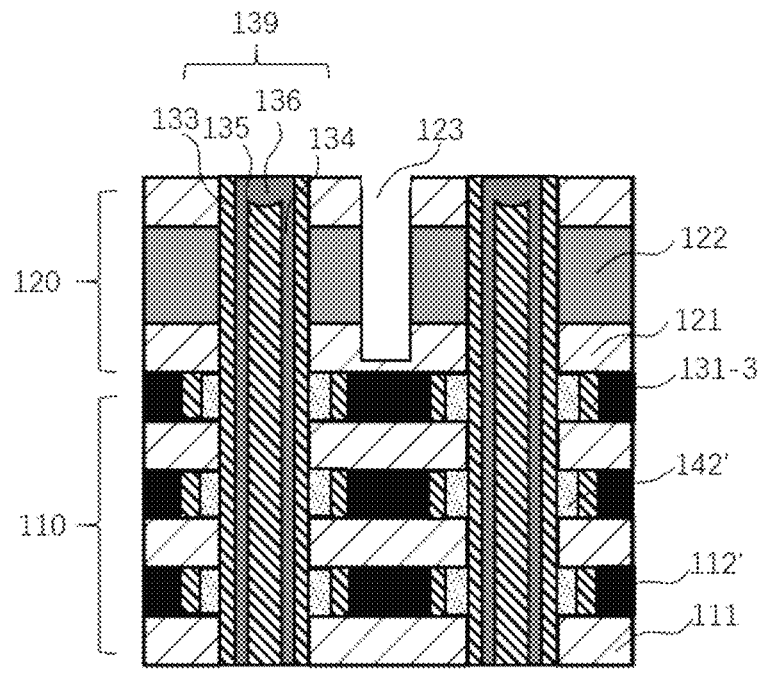
FIG. 28 is a local schematic diagram of a device structure after formation of an opening of an isolation structure of a fabrication method of a three-dimensional memory according to Implementation II of the present application.

As shown in FIG. 28, in some implementations, an opening 123 may be formed in the second stack 120 by, for example, an anisotropic dry etching process after the formation of the conductor layers 112'.

In some examples, a thickness of the second stack 120 formed is relatively small, and a thickness range, for example, may be of a nanoscale, so that the opening 123 can be relatively easily formed by etching the second stack 120, wherein the opening 123 may run through the second stack 120 and stop in the second dielectric layer 121 in contact with the first stack 110.

As mentioned before, at the sacrificial layers 112 of the first stack 110, the wall thickness of the adjacent channel structures 139 becomes small, and the reduced wall thickness is D2, while in the second stack 120, the wall thickness D2 of the adjacent channel structures 139 is almost retained; when the opening 123 is formed through the second stack 120 with the wall thickness D1, its process window is almost not reduced. A process window of the isolation structure 124 may not necessarily be increased if certain process conditions are met, and the occurrence of occupation of part of the channel structures 139 or addition of a row of dummy channel structure or additional increase of the wall thickness between the adjacent channel structures 139 can be reduced to some extent. Therefore, the loss of the memory density can be reduced to some extent.

In some examples, the opening 123 may be filled with an insulating material to form the isolation structure 124 as shown in FIG. 29. The insulating material filled comprises one or more of an oxide material (e.g., silicon oxide), a nitride material (e.g., silicon nitride), and an oxynitride (e.g., silicon oxynitride) material. As an option, planarization treatment may be carried out for a top surface of the isolation structure 124 using chemical mechanical polishing. In some examples, the isolation structure 124 may serve as a top select gate cut line to be disposed between the adjacent second gate slits to split the finger areas into multiple sub-areas to carry out more precise control for memory strings of the sub-areas.

In some examples, for example, when the material of the conductor layers 112' and the material of the conductive layers 122 both comprise a metal, the second dielectric layers 121 and the conductive layers 122 may be etched alternately by selecting different etching gases, and the etching time is controlled, so that etching can stop in the second dielectric layer 121 in contact with the first stack 110.

In some implementations, the isolation structure 124 may be formed in the second stack 120 after the formation of the first stack 110 and the second stack 120 and before the formation of the channel holes 130. In some implementations, to simplify the process, the channel holes 130 and the top select gate opening 123 may be formed simultaneously by a suitable etching process.

In some implementations, the isolation structure 124 may also be formed in the second stack 120 after the formation of the channel structures 139.

For the fabrication method provided by the implementations of the present application, since the conductive layers 122 serving as the top select gate layers are formed by a direct deposition process, the isolation structure 124 may be formed at any suitable step under a multi-hole array (exceeding "9-hole array") structure, thereby avoiding limitations to a formation process of the isolation structure 124 caused by the formation of the conductive layers 122 by the gate replacement process.

Another aspect of the implementations of the present application provides a three-dimensional memory 100'. FIG. 29 illustrates a local structure schematic of the three-dimensional memory 100'. As shown in FIG. 29, the three-dimensional memory 100 comprises a substrate (not shown in the figure), a stack structure 102 formed on the substrate, and a plurality of channel structures 139 and an isolation structure 124 which are formed in the stack structure 102, and the isolation structure 124 may be disposed between the adjacent channel structures 139.

In some examples, a fabrication material of the substrate may be chosen from any suitable semiconductor materials, for example, monocrystalline silicon, polysilicon, monocrystalline germanium (Ge), silicon germanium (GeSi), silicon carbide (SiC), silicon on insulator (SOI), germanium on insulator (GOI), or III-V compounds, such as gallium arsenide, etc.

As shown in FIG. 29, in some implementations, the stack structure 102 comprises a first stack 110 and a second stack 120 that are formed in sequence on the substrate; the first stack 110 comprises first dielectric layers 111 and conductor layers 112' (also called as "control gate layers") which are stacked alternately; the second stack 120 comprises second dielectric layers 121 and conductive layers 122 (also called as "top select gate layers") which are stacked alternately, wherein the second stack 120 and the first stack 110 are stacked in the same stacking direction.

In some examples, the first stack 110 may comprise a plurality of pairs of first dielectric layer 111/sacrificial layer 112, and the number of the pairs may be selected according to various application scenes. In some examples, a material of the first dielectric layers 111 comprises silicon oxide, silicon nitride, silicon oxynitride, organosilicate glass (OSG), a spin-coating dielectric material, a dielectric metal oxide generally known as a high dielectric constant (high k) dielectric oxide (e.g., aluminum oxide, hafnium oxide, etc.) and silicate thereof, dielectric metal oxynitride and silicate thereof, and an organic insulating material. As an example, the first dielectric layers 111 may comprise silicon oxide, and the sacrificial layers 112 may comprise silicon nitride.

In some examples, the second stack 120 may comprise at least one pair of second dielectric layer 121/conductive layer 122, and the number of the pairs may be less than that of the pairs of first dielectric layers 111/sacrificial layers 112. As an example, the number of the pairs of second dielectric layer 121/conductive layer 122, for example, may be 1, 2, 4 or more.

In some examples, the second stack 120 is relatively thin, and a thickness range, for example, may be of a nanoscale.

In some examples, the conductive layers 122 may comprise a semiconductor material which, for example, may comprise polysilicon or metal silicide. As an option, the conductive layers 122 comprise P-type doped (e.g., boron-doped) polysilicon such that a threshold voltage of a top select gate transistor is positive when the conductive layers 122 serve as top select gate layers, thereby turning off a controlled channel.

In some examples, a conductive material of the conductive layers 122 may comprise a metal, such as W, Co, Cu, Al, Ti, Ta, Ni, etc., which has such a work function that a threshold voltage of a top select gate transistor is positive when the conductive layers 122 serve as top select gate layers, thereby turning off a controlled channel.

In some examples, a material of the conductor layers 112' may be different from that the conductive layers 122, for example, the material of the conductor layer 112' may comprise a metal, such as W, Co, Cu, Al, Ti, Ta, Ni, etc., while the conductive layers may comprise a semiconductor material, such as P-type doped polysilicon, metal silicide, etc.

In some other examples, the material of the conductor layers 112' and the material of the conductive layers 122 may be the same, for example, may both comprise a metal.

In some examples, a material of the second dielectric layers 121 may be the same as that of the first dielectric layers 111.

In some embodiments, a staircase structure (not shown in FIG. 29) may be formed on the two sides or in a position near the middle of the stack structure 102 to lead out word lines.

As shown in FIG. 29, in some implementations, the channel structures 139 comprise a plurality of first portions 139-1 formed by surrounding of the conductive layers 122 in a circumferential direction, and a plurality of second portions 139-2 surrounded by the second stack 120 and the first dielectric layers 111 in the circumferential direction.

In some examples, between the adjacent dielectric layers 111, each first portion 139-1 comprises a plurality of first charge blocking portions 131-3 and a plurality of charge storage portions 142', wherein each first charge blocking portion 131-1 may cover sidewalls of the conductor layers 112'. As an option, the plurality of charge storage portions 142' may be disposed discontinuously in a stacking direction, wherein each charge storage portion 142' may cover sidewalls of the first charge blocking portions 131-3. Exemplarily, a material for the first charge blocking portions 131-3 may comprise silicon oxide, silicon nitride, silicon oxynitride, and a high-K dielectric material such as aluminum oxide or hafnium oxide.

During operation of the three-dimensional memory, the plurality of discontinuous charge storage portions 142' can reduce a loss of charge stored therein due to diffusion in adjacent memory cells, thereby improving a data retention ability of the three-dimensional memory. Furthermore, the discontinuous charge storage portions 142' can improve a coupling effect of the memory cells caused by nonuniform electric field distribution, thereby improving the reliability of the three-dimensional memory.

In some implementations, the first portions 139-1 and the second portions 139-2 may further comprise tunneling layers 133, channel layers 134 and dielectric cores 135 which are disposed in sequence on sidewalls of the charge storage portions 142', and sidewalls of the second stack 120 and the first dielectric layers 111 respectively, and spaces defined by the channel layers 134 may be filled with the dielectric cores 135, wherein charge trapped by the charge storage portions 142' may be tunneled into the channel layers 134 through the tunneling layers 133 and transferred in the channel layers 134.

In some examples, in the stacking direction, the respective first charge blocking portions 131-3 and the corresponding charge storage portions 142' and the conductor layers 112' may have the same dimension. Therefore, the first charge blocking portions 131-3 formed by implementations of the present application may not occupy spaces of the conductor layers 112' in the stacking direction, and under the same stacking height, more layers of the first dielectric layers 111 and the conductor layers 112' can be stacked, thereby increasing a memory capacity.

Exemplarily, a material for the first charge blocking portions 131-3 may comprise silicon oxide, silicon nitride, silicon oxynitride, and a high-K dielectric material such as aluminum oxide or hafnium oxide.

Exemplarily, a material for the tunneling layers 133 may comprise silicon oxide, silicon nitride and silicon oxynitride, and a material for the channel layers 134 may comprise one or more semiconductor materials, e.g., a single-element semiconductor material, a III-V compound semiconductor material, a II-VI compound semiconductor material and/or an organic semiconductor material. In some embodiments, the channel layers 134 may comprise polysilicon layers for promoting charge transfer. In some examples, the dielectric cores 135 may comprise a suitable dielectric material, for example, silicon oxide. As an example, the channel structures 139 corresponding to the first stack 110 may comprise a silicon oxide-silicon nitride-silicon oxide-silicon nitride-polysilicon (ONOP) structure.

It may be understood that, the channel structures 139 surrounded by the second stack 110 may not comprise a storage layer for storing charge. As an option, when the blocking layers 131 and the tunneling layers 133 comprise silicon oxide, the blocking layers 131 and the tunneling layers 133 may act as gate oxide layers of an MOS transistor.

Exemplarily, channel plugs 136 may be further formed at tops of the channel structures 139 away from the substrate, and can increase a contact area and a process window for bit line contact landing.

As shown in FIG. 29, in some embodiments, the first portions 139-1 of the channel structures 139 surrounded by the conductor layers 112' have a first radial dimension L1, and the second portions 139-2 surrounded by the second stack 120 and the first dielectric layers 111 have a second radial dimension L2, wherein the first radial dimension L1 is greater than the second radial dimension L2. Consequently, in the second stack 120, the adjacent channel structures 139 have a wall thickness D2 therebetween; in the first stack 110, the adjacent channel structures 139 have different and alternative wall thicknesses therebetween; at the first dielectric layers 111, the adjacent channel structures may have the wall thickness D2 therebetween, while at the conductor layers 112', the adjacent channel structures 139 have a wall thickness D1 therebetween, wherein D2 is greater than D1.

In some implementations, the three-dimensional memory 100' further comprises a gate slit structure (not shown in FIG. 28) which penetrates through the second stack 120 and the first stack 110 to divide the stack structure 102 into a plurality of finger areas. In some examples, the gate slit structure comprises insulating layers filled in gate slits penetrating through the second stack 120 and the first stack 110, and conductive paths formed in spaces defined by the insulating layers, wherein the insulating layers may be used for electrically isolating the conductive layers 122 and the conductor layers 112' from the conductive paths respectively, and the conductive paths may serve as lead-out paths for electrical connection of a common source line.

In some implementations, the isolation structure 124 may penetrate through the conductive layers 122 and is located between the adjacent channel structures 139, and stops in the second dielectric layer 121 in contact with the first stack 110. As an example, the isolation structure 124 may comprise an insulating material filled in an opening formed through the second stack 120, and the insulating material filled comprises one or more of an oxide material (e.g., silicon oxide), a nitride material (e.g., silicon nitride), and an oxynitride (e.g., silicon oxynitride) material.

In some examples, the isolation structure 124 may serve as a top select gate cut line to be disposed between the adjacent second gate slits to split the finger areas into multiple sub-areas to carry out more precise control for memory strings of the sub-areas.

The above described are merely the description of implementations of the present application and technical principles used. Those skilled in the art should understand that, the protection scope of the present application is not limited to the technical solutions formed by specific combinations of the above technical features, and meanwhile, should also encompass other technical solutions formed by any combinations of the above technical features or equivalent features thereof, without departing from the technical concept, for example, technical solutions formed by interchanging of the above features and the technical features with similar functions as disclosed (but not limited to those) in the present application.

What is claimed is:

1. A three-dimensional memory, comprising:
    a stack structure comprising a first stack and a second stack, wherein the first stack comprises control gate layers and first dielectric layers stacked alternately in a stacking direction, the second stack comprises top select gate layers and second dielectric layers stacked alternately in the stacking direction;
    channel structures extending through the stack structure, wherein the channel structures comprise charge storage layers, the charge storage layers comprise charge storage portions disposed discontinuously in the stacking direction, and the charge storage portions are disposed between adjacent first dielectric layers; and
    at least one isolation structure extending through the top select gate layers in the stacking direction,
    wherein:
    the top select gate layers extend in a lateral direction and are positioned above each of the charge storage layers of the channel structures; and
    the at least one isolation structure is an electrically insulating structure and extends through one of the top select gate layers, with a portion of the at least one isolation structure between the second dielectric layers, a sidewall of the portion of the at least one isolation structure being entirely surrounded by the one of the top select grate layers without contacting the channel structures.

2. The three-dimensional memory of claim 1, wherein the top select gate layers and the control gate layers are made of different materials.

3. The three-dimensional memory of claim 1, wherein the top select gate layers comprise a semiconductor material comprising polysilicon or metal nitride.

4. The three-dimensional memory of claim 3, wherein the semiconductor material comprises boron-doped polysilicon.

5. The three-dimensional memory of claim 1, wherein the channel structures comprise a plurality of first portions at least partially surrounded by the control gate layers, and a plurality of second portions at least partially surrounded by the second stack and the first dielectric layers, wherein a first radial dimension of the first portions is greater than a second radial dimension of the second portions.

6. The three-dimensional memory of claim 5, wherein each of the first portions comprises first charge blocking portions and the charge storage portions; and between the adjacent first dielectric layers, wherein the charge storage portions cover sidewalls of the first charge blocking portions.

7. The three-dimensional memory of claim 6, wherein the first portions further comprise tunneling layers, channel layers and dielectric cores which are disposed in sequence on sidewalls of the charge storage portions.

8. The three-dimensional memory of claim 6, wherein the first charge blocking portions cover inner walls surrounded by the adjacent first dielectric layers and the control gate layers therebetween.

9. The three-dimensional memory of claim 6, wherein the second portions comprise a plurality of second charge blocking portions, tunneling layers, channel layers, and dielectric cores disposed in sequence on sidewalls of the second stack and the first dielectric layers, wherein the first charge blocking portions and the second charge blocking portions constitute continuous blocking layers.

10. The three-dimensional memory of claim 6, wherein in the stacking direction, the first charge blocking portions and the charge storage portions have a same dimension.

11. The three-dimensional memory of claim 6, wherein in the stacking direction, the first charge blocking portions and the control gate layers have a same dimension.

12. The three-dimensional memory of claim 6, wherein the first charge blocking portions comprise silicon oxynitride or silicon oxide, and the charge storage portions comprise silicon nitride.

13. The three-dimensional memory of claim 1, wherein, in the stacking direction, a thickness of the one of the top select gate layers is greater than a thickness of one of the control gate layers.

14. The three-dimensional memory of claim 1, wherein a surface of the one of the top select gate layers continuously contacts a surface of the one of the second dielectric layers.

15. The three-dimensional memory of claim 1, wherein a first conductive material of the one of the top select gate layers is different from a second conductive material of one of the control gate layers, and the first conductive material is in direct contact with the one of the second dielectric layers.

16. The three-dimensional memory of claim 1, wherein an inner radial dimension of one of the charge storage portions in one of the channel structures is less than an outer radial dimension of a tunnel layer in the one of the channel structures surrounded by one of the first dielectric layers.

17. The three-dimensional memory of claim 1, wherein a first outer radial dimension of a tunnel layer of one of the channel structures surrounded by one of the charge storage portions in the one of channel structures is less than a second outer radial dimension of the tunnel layer surrounded by one of the first dielectric layers.

18. The three-dimensional memory of claim 1, wherein the one of the top select gate layer is arranged between any two adjacent ones of the channel structures.

19. A three-dimensional memory, comprising:
- a stack structure comprising a first stack and a second stack, wherein the first stack comprises control gate layers and first dielectric layers stacked alternately in a stacking direction, the second stack comprises top select gate layers and second dielectric layers stacked alternately in the stacking direction;
- channel structures extending through the stack structure, wherein the channel structures comprise charge storage layers, the charge storage layers comprise charge storage portions disposed discontinuously in the stacking direction, and the charge storage portions are disposed between adjacent first dielectric layers; and
- at least one isolation structure extending through the top select gate layers located between adjacent channel structures, wherein:
- the top select gate layers extend in a lateral direction and are positioned above each of the charge storage layers of the channel structures;
- an entirety of one of the top select gate layers comprises a conductive material, and the at least one isolation structure passes through the conductive material of the one of the top select gate layers; and the conductive material of the one of the top select gate layers, between the adjacent channel structures, is in contact with one of the second dielectric layers.

20. A three-dimensional memory, comprising:
- a stack structure comprising a first stack and a second stack, wherein the first stack comprises control gate layers and first dielectric layers stacked alternately in a stacking direction, the second stack comprises top select gate layers and second dielectric layers stacked alternately in the stacking direction;
- channel structures extending through the stack structure, wherein the channel structures comprise charge storage layers, the charge storage layers comprise charge storage portions disposed discontinuously in the stacking direction, and the charge storage portions are disposed between adjacent first dielectric layers; and
- at least one isolation structure extending through the top select gate layers and is located between adjacent first and second channel structures of the channel structures, wherein:
- the at least one isolation structure is an electrically insulating structure and extends through one of the top select gate layers, with a portion of the at least one isolation structure between the second dielectric layers, a sidewall of the portion of the at least one isolation structure being entirely surrounded by the one of the top select gate layers without contacting the channel structures; and
- a first conductive material of one of the top select gate layers is different from a second conductive material of one of the control gate layers, and the at least one isolation structure passes through the first conductive material that is between the first and second channel structures and in direct contact with one of the second dielectric layers.

* * * * *